(12) United States Patent
Zhang et al.

(10) Patent No.: US 7,023,209 B2
(45) Date of Patent: Apr. 4, 2006

(54) METHOD AND APPARATUS FOR MAGNETIC RESONANCE IMAGING AND SPECTROSCOPY USING MICROSTRIP TRANSMISSION LINE COILS

(75) Inventors: Xiaoliang Zhang, Minneapolis, MN (US); Kamil Ugurbil, Minneapolis, MN (US); Wei Chen, Roseville, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 334 days.

(21) Appl. No.: 09/974,184

(22) Filed: Oct. 9, 2001

(65) Prior Publication Data

US 2002/0079996 A1 Jun. 27, 2002

Related U.S. Application Data

(60) Provisional application No. 60/239,185, filed on Oct. 9, 2000.

(51) Int. Cl.
*G01V 3/00* (2006.01)

(52) U.S. Cl. ....................................................... 324/318
(58) Field of Classification Search ......... 324/307–318, 324/322; 600/410, 422; 333/219, 221, 225, 333/230–233, 235, 202–205; 375/308, 340, 375/500
See application file for complete search history.

(56) References Cited

U.S. PATENT DOCUMENTS

| | | | | | |
|---|---|---|---|---|---|
| 4,620,155 | A | * | 10/1986 | Edelstein | 324/322 |
| 4,626,800 | A | * | 12/1986 | Murakami et al. | 331/96 |
| 4,679,015 | A | * | 7/1987 | Murakami et al. | 333/219.2 |
| 4,686,473 | A | * | 8/1987 | Chesneau et al. | 324/320 |
| 4,704,739 | A | * | 11/1987 | Murakami et al. | 455/325 |

(Continued)

FOREIGN PATENT DOCUMENTS

| | | | |
|---|---|---|---|
| JP | 04-246332 | | 9/1992 |
| JP | 07321514 A | * | 12/1995 |
| JP | 02-503993 | | 6/1996 |
| JP | 01-503360 | | 3/2001 |
| WO | 99/54759 | | 10/1999 |
| WO | WO-00/72033 | | 11/2000 |

OTHER PUBLICATIONS

Seeber et al., "Triaxial magnetic field gradient system for microcoli magnetic resonance imaging", Nov. 2000, Review of Scientific Instruments, vol. 71, No. 11, pp. 4263–4272.*

(Continued)

*Primary Examiner*—Brij B. Shrivastav
*Assistant Examiner*—Dixomara Vargas
(74) *Attorney, Agent, or Firm*—Schwegman, Lundberg, Woessner & Kluth, P.A.

(57) ABSTRACT

Apparatus and method for MRI imaging using a coil constructed of microstrip transmission line (MTL coil) are disclosed. In one method, a target is positioned to be imaged within the field of a main magnetic field of a magnet resonance imaging (MRI) system, a MTL coil is positioned proximate the target, and a MRI image is obtained using the main magnet and the MTL coil. In another embodiment, the MRI coil is used for spectroscopy. MRI imaging and spectroscopy coils are formed using microstrip transmission line. These MTL coils have the advantageous property of good performance while occupying a relatively small space, thus allowing MTL coils to be used inside restricted areas more easily than some other prior art coils. In addition, the MTL coils are relatively simple to construct of inexpensive components and thus relatively inexpensive compared to other designs. Further, the MTL coils of the present invention can be readily formed in a wide variety of coil configurations, and used in a wide variety of ways. Further, while the MTL coils of the present invention work well at high field strengths and frequencies, they also work at low frequencies and in low field strengths as well.

107 Claims, 18 Drawing Sheets

U.S. PATENT DOCUMENTS

| | | | | |
|---|---|---|---|---|
| 4,712,067 A | * | 12/1987 | Roschmann et al. | 324/318 |
| 4,792,760 A | * | 12/1988 | Jacob et al. | 324/322 |
| 4,983,936 A | * | 1/1991 | Murakami et al. | 333/202 |
| 5,185,573 A | * | 2/1993 | Larson, III | 324/309 |
| 5,270,656 A | * | 12/1993 | Roberts et al. | 324/318 |
| 5,363,113 A | | 11/1994 | Mamets et al. | |
| 5,514,337 A | * | 5/1996 | Groger et al. | 422/82.08 |
| 5,530,424 A | * | 6/1996 | Harrison et al. | 340/500 |
| 5,530,425 A | * | 6/1996 | Harrison | 340/500 |
| 5,646,962 A | * | 7/1997 | Harrison | 375/308 |
| 5,739,812 A | * | 4/1998 | Mochizuki et al. | 345/163 |
| 5,757,189 A | * | 5/1998 | Molyneaux et al. | 324/318 |
| 5,886,596 A | * | 3/1999 | Vaughan, Jr. | 333/219 |
| 5,898,306 A | * | 4/1999 | Liu et al. | 324/322 |
| 5,903,198 A | * | 5/1999 | Weiss | 333/24.1 |
| 5,949,311 A | * | 9/1999 | Weiss et al. | 333/202 |
| 5,990,681 A | * | 11/1999 | Richard et al. | 324/318 |
| 5,998,999 A | * | 12/1999 | Richard et al. | 324/318 |
| 6,023,166 A | * | 2/2000 | Eydelman | 324/318 |
| 6,054,854 A | * | 4/2000 | Kawamoto | 324/318 |
| 6,060,882 A | * | 5/2000 | Doty | 324/318 |
| 6,133,737 A | * | 10/2000 | Greim | 324/318 |
| 6,215,307 B1 | * | 4/2001 | Sementchenko | 324/318 |
| 6,323,779 B1 | * | 11/2001 | Murakami et al. | 340/686.3 |
| 6,369,570 B1 | * | 4/2002 | Wong et al. | 324/318 |
| 6,396,271 B1 | * | 5/2002 | Burl et al. | 324/318 |
| 6,420,871 B1 | * | 7/2002 | Wong et al. | 324/318 |
| 2002/0180439 A1 | * | 12/2002 | Lee | 324/318 |

OTHER PUBLICATIONS

Sultan, "Extended analysis of closed–ring microstrip antenna", Feb. 1989, IEE Proceedings, vol. 136, pp. 67–69.*

Codreanu et al., "Influence of dielectric substrate on the responsivity of microstrip dipole–antenna–coupled infrared microbolometers", Apr. 1, 2002, Applied Optics, vol. 41, No. 10, pp. 1835–1840.*

Gao et al., "A dual–frequency compact microstrip patch antenna", Nov. 2001, Radio Science, vol. 36, No. 6, Pag 1669–1682.*

Bogdanov et al., "Coupled Microstrip Line Transverse Electromagnetic Resonator Model for High–Field Magnetic Resonance Imaging", Oct. 19, 2001, Magnetic Resonance in Medicne 47, pp. 579–593.*

Lee, "Parallel Magnetic Resonance Imaging: Encoding Theory and Antenna Design", Jul. 2000, UMI Dissertation Services, pp. 85–107.*

Bushong, "Magnetic Resonance Imaging Pyhsical and Biological Principles" 1996, Mosby–Year Book, 2nd Ed., pp. 160–163.*

"Shielded Microstrip Transmission Line" http://wes.feec.vutbr.cz/~raida/multimedia_en/chapter–3/3_2A.html.*

"What is microstrip transmission line" http://www.csus.edu/indiv/o/oldenburgj/Microstrip%20Design/What%20is%microstrip%trans.doc.*

"Chapter 1 Microstrip Antennas" http://store.noblepub.com/pdfs/msantenna1.pdf.*

"Dual Polarization Star Microstrip Antennas" http://nemes.colorado.edu/microwave/papers/2001/Eu_BmdpBP01.pdf.*

Soon Sam Kim, Miniature Magnetic Resonance Spectrometers, IEEE, 1997, pp. 2.2–14–2.2–23.*

Makoto Tsutsumi, Nonlinear Behavior of Electromagnetic Waves in the YIG Film Microstrip Line, IEEE, 1998, pp. 841–844.*

K.C. Gupta, Microwave Circuits, Wiley Enciclopedia of Ellectronics Engineering Online, 1999.*

Zhewang Ma, Microstrip lines, Wiley Enciclopedia of Ellectronics Engineering Online, 1999.*

Alan R. Mickelson, Active Antennas, Wiley Enciclopedia of Ellectronics Engineering Online, 1999.*

TK Sarkar, Stripline Components, Wiley Enciclopedia of Ellectronics Engineering Online, 1999.*

Carmine Vittoria, Microstrip Antennas, Wiley Enciclopedia of Ellectronics Engineering Online, 2,000.*

Zhang, Xiaoliang, et al., "A microstrip transmission line volume coil for human head MR imaging at 4T", *Journal of Magnetic Resonance 161*, (2003),242–251.

Dravin, V.A., et al., "Measurements of the effective electrodynamical parameters of Nb microstrip resonator", *Int' conf on materials & Mechanisms superconductivity high temperature sueprconductors VI*, vol. 341–348 (IV) XP002187185, 2675–2676, (2000).

Kim, S.S., et al., "Miniature Magnetic Resonance Spectrometers", *16th dasc AIAA/IEEE Digital avionics systems conference. Reflections to the future*, XP002187183, 2.2–14–23, (1997).

Ledden, P.J., et al., "Use of a transmission line resonator as a volume phased array", *Proc. of the In'tl Soc of MRI in Medicine, 8th Sci. Mtg & Exhb.*, vol. 2, XP002187184, 1386, (Apr. 1–7, 2000).

Lee, R.F., et al., "Planar strip array antenna for parallel spatial encoded MRI", *Proc of the In'tl Soc for Magnetic Resonance in Medicine, 8th Sci Mtg & Exh.*, Denver, CO, vol. 1, XP002187182, 558, (Apr. 2000).

Vaughan, J.T., "An improved volumen coil for high field MRI", *Int'l Soc for MRI in Medicine, 7th Sci. Mtg & Exh.*, vol. 1, XP002173499, 167, (May 22, 1999).

Zhang, X., et al., "Microstrip RF surface coil design for extremely high–field MRI and spectroscopy", *Magnetic resonance in medicine*, vol. 46, No. 3, XP002187186, 443–450, (Sep. 2001).

* cited by examiner

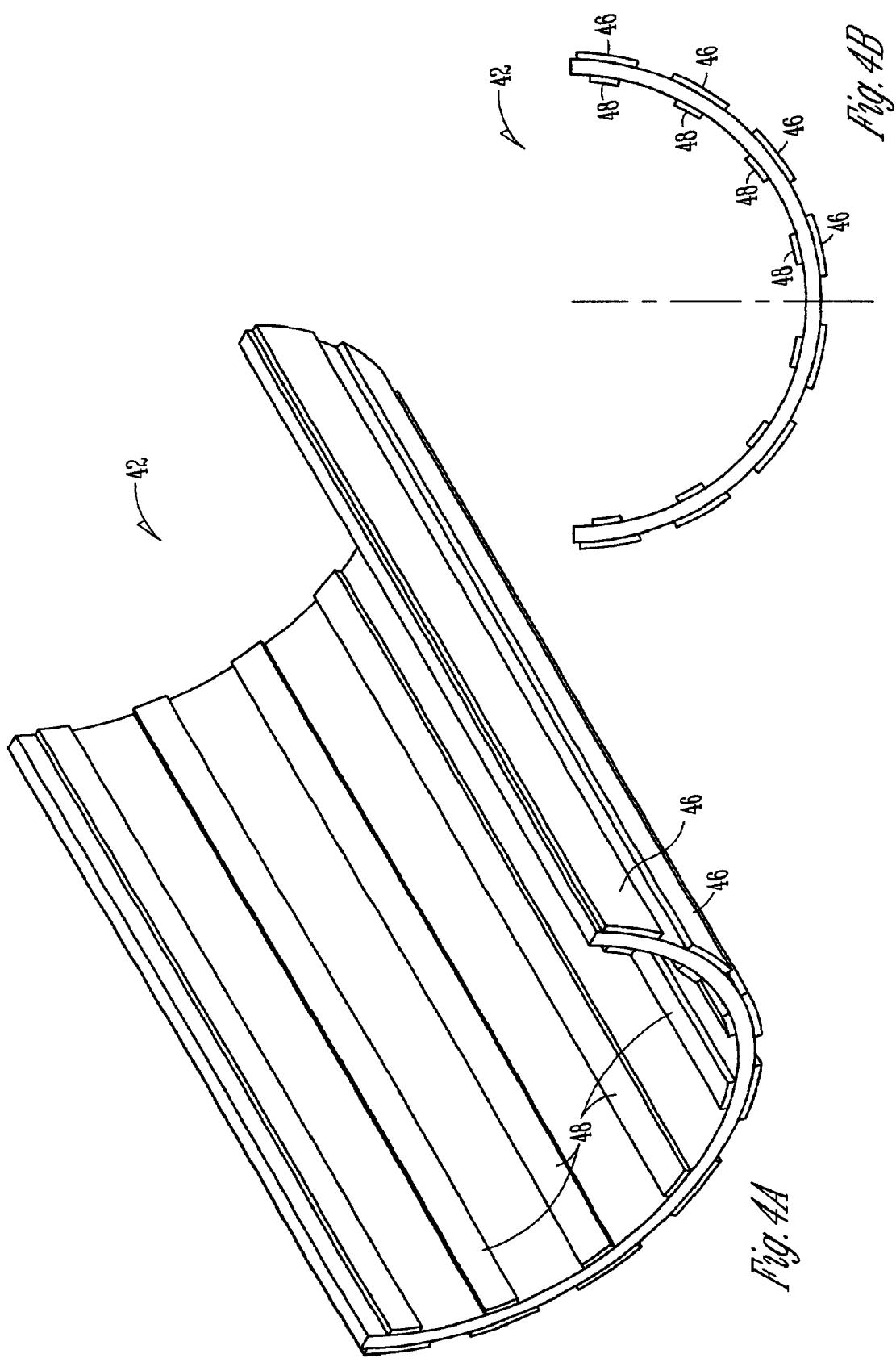

METHOD AND APPARATUS FOR MAGNETIC RESONANCE IMAGING AND SPECTROSCOPY USING MICROSTRIP TRANSMISSION LINE COILS

CROSS REFERENCE TO RELATED APPLICATIONS

This application is a continuation of provisional application Ser. No. 60/239,185, filed, Oct. 9, 2000, and entitled "Microstrip Resonator RF Surface and Volume Coils and Methods for NMR Imaging and Spectroscopy at High Fields." The entire contents of U.S. application Ser. No. 60/239,185 are hereby incorporated herein by reference.

GOVERNMENT RIGHTS

This invention was partially supported by NIH grants NS38070 (W.C.), NS39043 (W.C.), P41 RR08079 (a National Research Resource grant from NIH), Keck Foundation, National Foundation for Functional Brain Imaging and the US Department of Energy. The Government may have certain rights in the invention.

TECHNICAL FIELD OF THE INVENTION

This invention pertains generally to magnetic resonance imaging (MRI) and more specifically to surface and volume coils for MRI imaging and spectroscopy procedures.

BACKGROUND OF THE INVENTION

Surface and volume coils are used in MRI imaging or spectroscopy procedures in order to obtain more accurate or detailed images of tissue under investigation. Preferably, a MRI coil performs accurate imaging or spectroscopy across a wide range of resonant frequencies, is easy to use, and is affordable. Further, the operating volume inside the main magnet of many MRI systems is relatively small, often just large enough for a patient's head or body. As a result, there is typically little space available for a coil in addition to the patient. Accordingly, it is advantageous if a surface or volume coil itself occupies as little space as possible.

In high fields (3 Tesla and beyond), due to the high Larmour frequencies required, radiation losses of RF coils become significant which decreases a coil's quality factor or Q factor, and a low Q factor can result in low signal-to-noise ratio (SNR) in MRI procedures. One existing solution to reducing radiation losses is adding a RF shielding around the coil(s). The RF shielding, however, usually makes the physical size of RF coil much larger, which as noted above is not desired in the MR studies, especially in the case of high field operations.

SUMMARY OF THE INVENTION

According to certain example embodiments of the invention there are provided a MRI coil formed of microstrip transmission line. According to various embodiments of the invention, MRI coils according the present invention are easy to manufacture with relatively low cost components, and compact in design. In addition, the coil's distributed element design provides for operation at relatively high quality factors and frequencies and in high field (4 Tesla or more) environments. Further, microstrip coils according to the present invention exhibit relatively low radiation losses and require no RF shielding. As a result of not requiring RF shielding, the coils may be of compact size while having high operating frequencies for high field MR studies, thus saving space in the MRI machine. Further, the methods and apparatus of the present invention are not just good for high frequency MR studies, but also good for low frequency cases.

BRIEF DESCRIPTION OF THE DRAWING

FIGS. 2–14 illustrate various example embodiments of the apparatus of the invention.

DETAILED DESCRIPTION OF THE INVENTION

In the following detailed description of the preferred embodiments, reference is made to the accompanying drawings that form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only be the appended claims.

Method Embodiments

Figure 1:
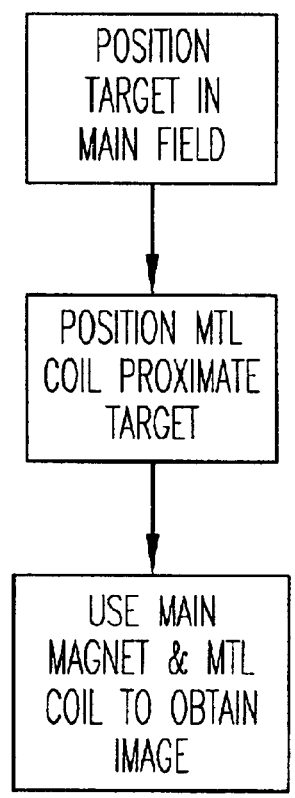
FIG. 1 illustrates a method according to one example embodiment of the invention.

According to a first method embodiment of the invention, as illustrated in FIG. 1, a target is positioned within the field of a main magnetic field of a magnet resonance imaging (MRI) system, at least one coil is positioned proximate the target wherein the coil is constructed using at least one microstrip transmission line, and the main magnet and the MTL coil are used to obtain MRI images from the target. According to one use of the microstrip transmission line (MTL) coil, it is operated as a receiver (pickup coil) or a transmitter (excitation coil) or both during an imaging procedure. As used herein the term "MTL coil" generally refers to any coil formed using a microstrip transmission line.

The microstrip transmission line, according to one example design, is formed of a strip conductor, a ground plane and a dielectric material that may be air, a vacuum, low loss dielectric sheets such as Teflon or Duroid, or liquid Helium or liquid Nitrogen. Further, the strip conductor or ground plane are, in one embodiment, formed in whole or in part from a non-magnetic conductive material such as copper or silver. According to another example embodiment of the invention, the ground planes for multiple strip conductors are arranged in one single piece foil so as to reduce radiation loss.

In another example embodiment, the MTL coil is a volume MTL coil having a plurality of microstrip transmission lines. In still another example embodiment, the volume MTL coil is detuned using PIN diodes. In yet another example embodiment, the MTL coil includes bisected ground planes and the PIN diodes are positioned in the gap of the bisected ground planes.

According to still other example embodiments of the methods of the invention, a MTL coil is tuned by varying capacitive termination of the MTL coil wherein, for example but not by way of limitation, the MTL coil is tuned by varying capacitive termination on each end of the MTL coil.

In still other example embodiments of the method, the microstrip transmission line is arranged in a rectangular or circular configuration, or, in the alternative, in an S shape. In one advantageous embodiment, the MTL coil is constructed using at least two turns to improve the homogeneity of the magnetic field characteristics.

In still other example embodiments, one or more lumped elements are connected to the transmission line and operated so as to match the impedance of the line.

In yet still another embodiment, an MTL coil is operated in a resonant mode by bisection of the ground plane and tuning of the resonance by adjusting displacement of the ground planes. In another embodiment, at least two of the MTL coils are operated in a quadrature mode. In still another embodiment, a coil is arranged so as to operate as a ladder MTL coil. In yet another embodiment, at least two MTL coils are arranged and operated as a half volume MTL coil.

In still another example embodiment, an inverted imaging MTL coil is formed wherein the dielectric material is positioned in a plane on the side of the strip conductor plane in the direction of the field, and wherein coupling is capacitive.

In yet another example embodiment of the methods of the invention, the MTL coil is driven using a capacitive impedance matching network. In still another example embodiment of the methods of the invention, the dielectric constant Er is adjusted to change the resonant frequency of the MTL coil.

In yet still another example embodiment of the method, the coil dielectric substrate is flexible, and the MTL coil is formed and used in more than one configuration allowing a single coil to be adapted to multiple purposes. According to still another embodiment, the substrate is formed of thin layers of Teflon or other dielectric material allowing the substrate to be bent or twisted.

Apparatus Embodiments

Figure 2A:
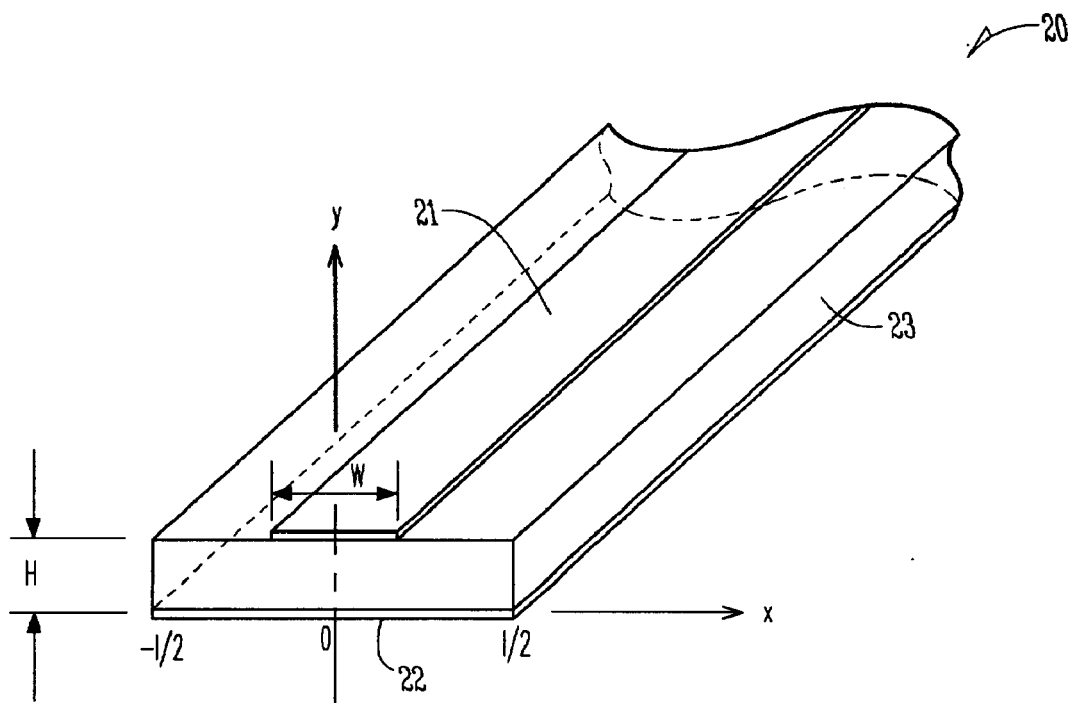
Figure 2B:
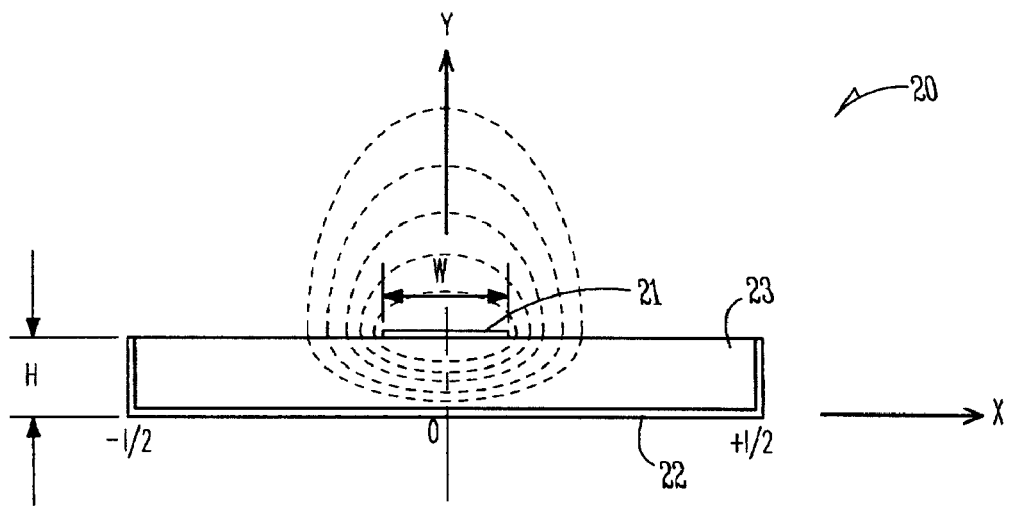

Referring first to FIGS. 2A and 2B, there is illustrated in diagrammatic form an example embodiment of a microstrip transmission line (MTL) 20 having a strip conductor 21 with a width W and ground plane 22, on either side of a dielectric substrate 23 having a height H and dielectric coefficient Er. Magnetic field lines H are shown surrounding strip conductor 21 and emanating outward in the Y direction orthogonal to ground plane 22 and along the length of strip conductor 21. As illustrated, the field is contained in whole or in part on one side of the strip conductor 21 by the ground plane 22, and extends outwardly beyond the plane of the strip conductor in a direction extending away from the ground plane.

Figure 2C:
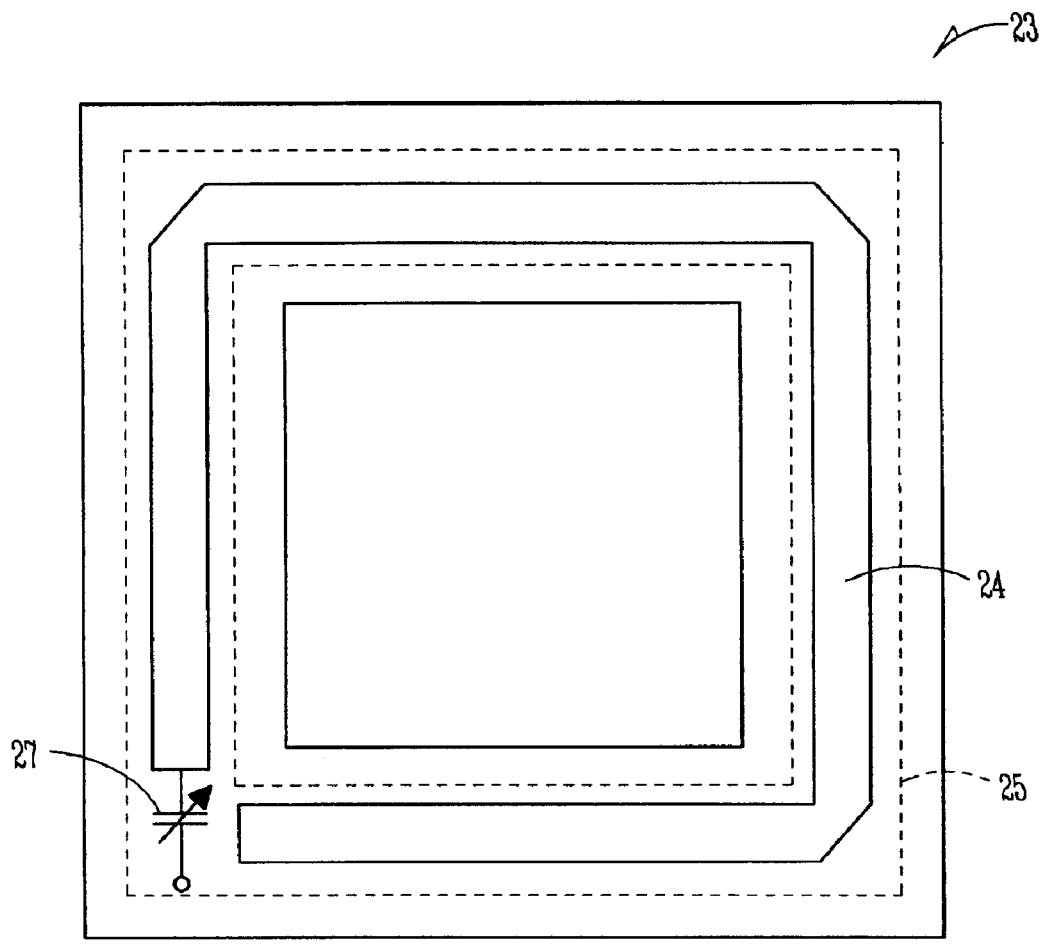
Figure 2D:
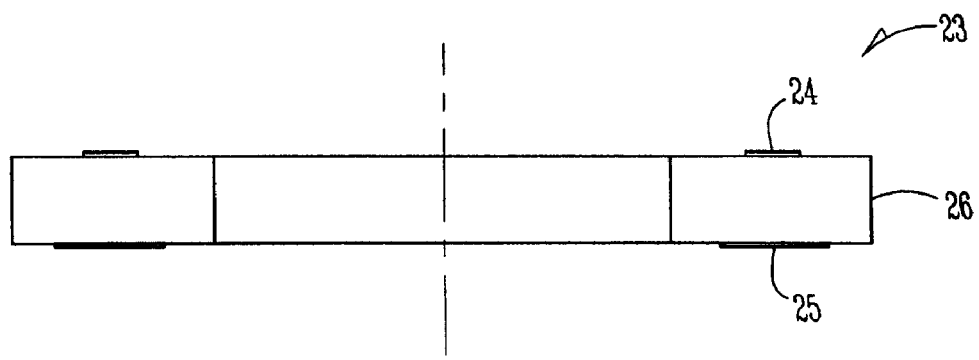

According to a first embodiment of the apparatus of the invention, as illustrated in FIGS. 2C and 2D, there is provided a single turn MRI imaging or spectroscopy MTL coil 23 constructed using at least one microstrip transmission line. The microstrip transmission line coil, according to one example design, is formed of a strip conductor 24, a ground plane 25 and a substrate 26 made of a dielectric material that may be air, a vacuum, a single or multilayer low loss dielectric sheets such as Teflon or Duroid materials, or liquid Helium or Nitrogen. According to one example embodiment, such coil is 9 cm×9 cm, has a substrate 26 that is 5–7 mm, uses copper foil 36 microns in thickness (for example an adhesive-backed copper tape such as is available from 3M Corporation of St. Paul, Minn.) for the strip conductors and ground plane, and has a resonant frequency of 300 MHz. According to one example embodiment, the MRI signal intensity is proportional to H when H<5 mm and reaches a maximum when H 5 mm. These results indicate that the optimized H value is about 5–7 mm for the above embodiments of the microstrip MTL coils according to the present invention. Further, the dielectric material thickness H, or more accurately, the ratio W/H, is an important parameter that affects the B1 penetration in air. If H is too small, or W/H too large, most of electromagnetic fields will be compressed around the strip conductor. Although the B1 penetration will increase with the increase of dielectric material thickness H, or the decrease of the ratio W/H, a thickness of 5–7 mm is suggested in practice because the radiation loss can become significant when the substrate is much thicker. This optimized H makes it possible to build a very thin surface coil at extremely high fields, where the coil thickness can, in certain circumstances, be less than the conventional surface coil with RF shielding.

Figure 3A:
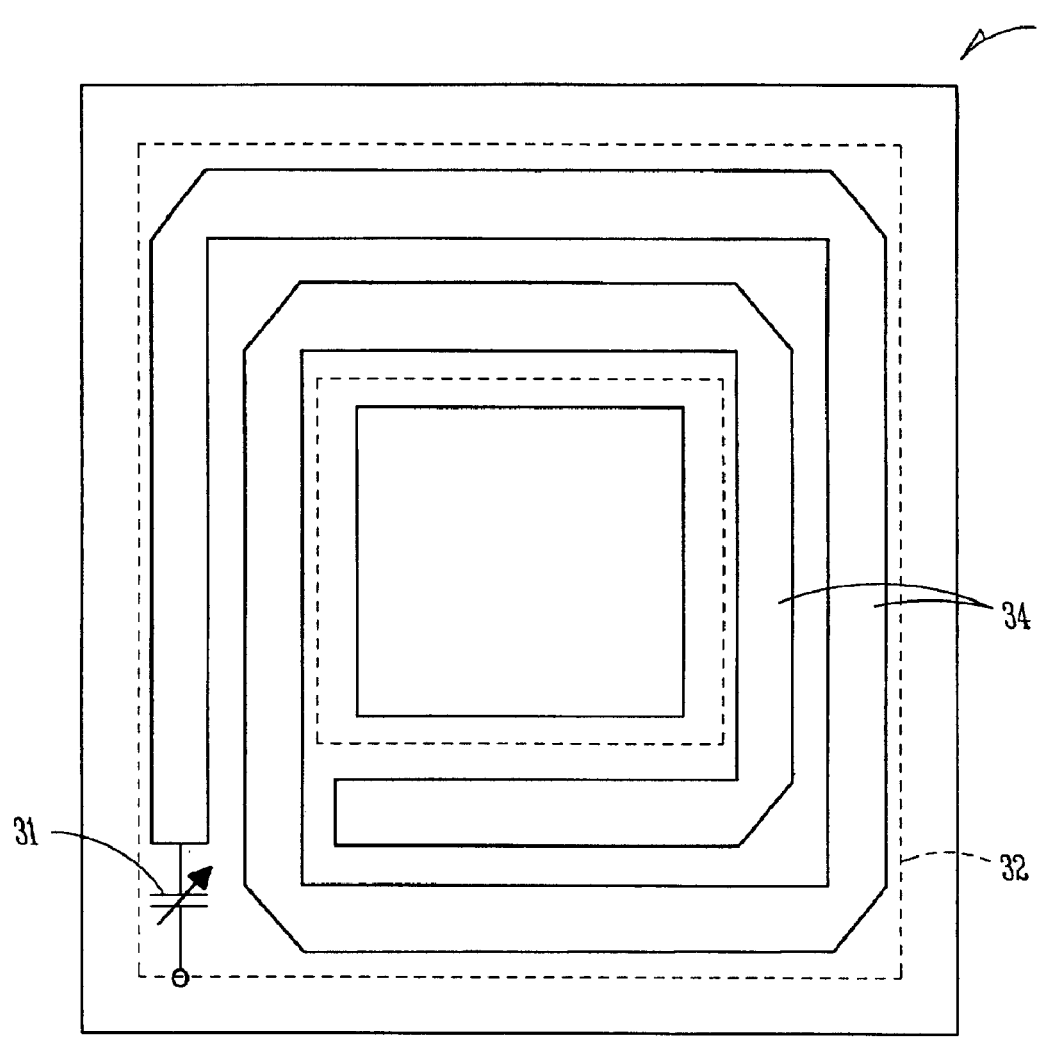
Figure 3B:
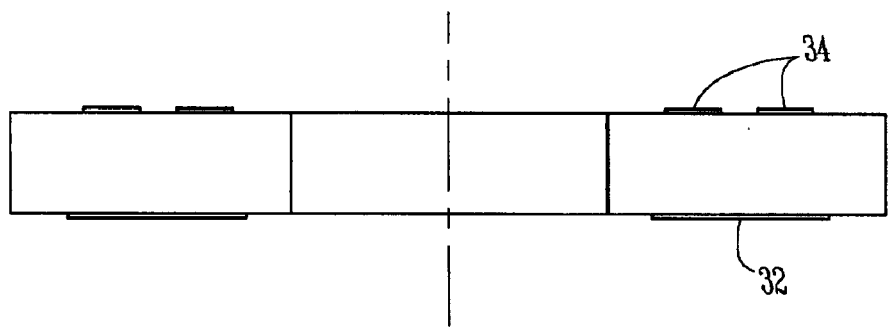
Figure 3C:
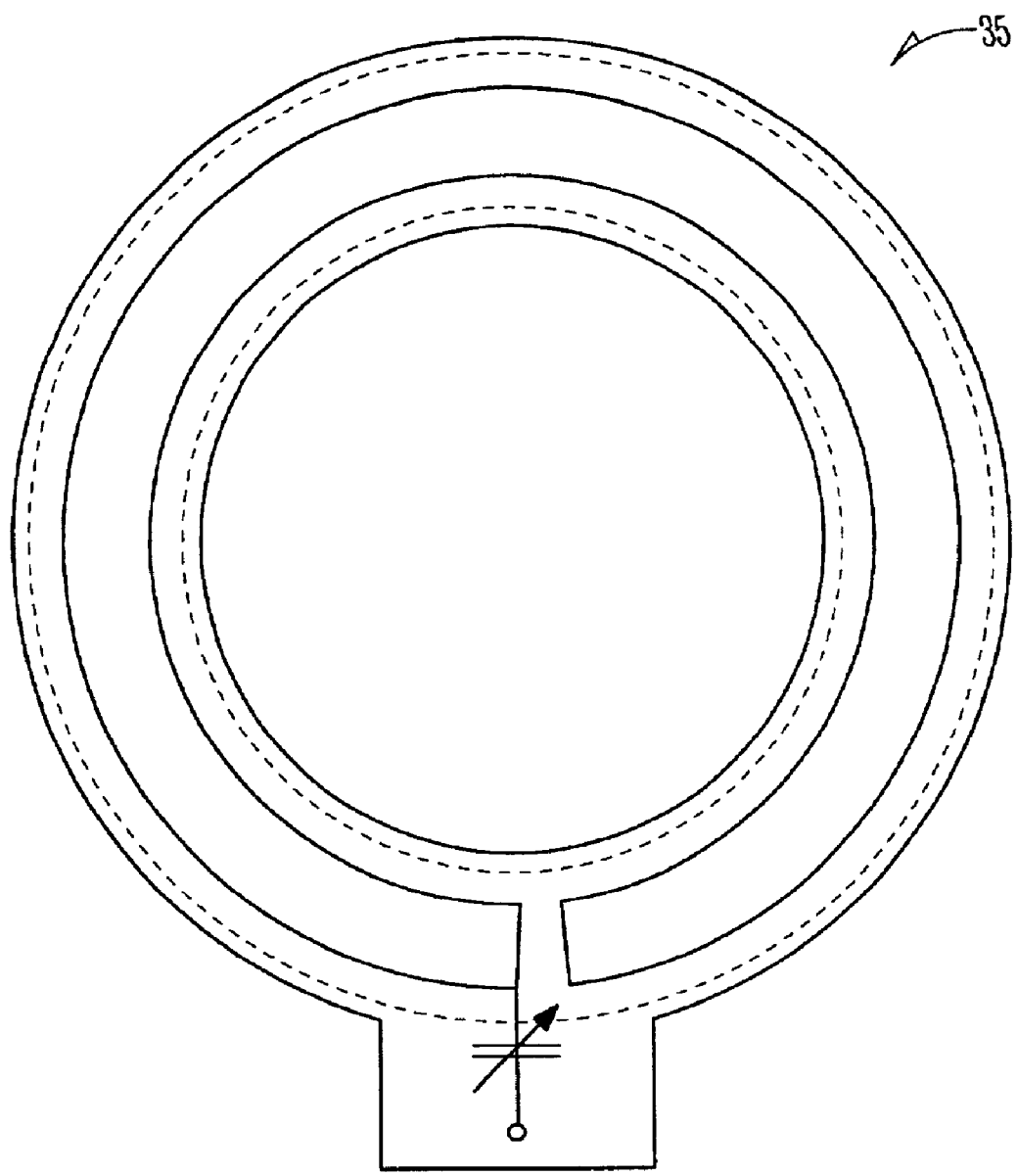
Figure 3D:
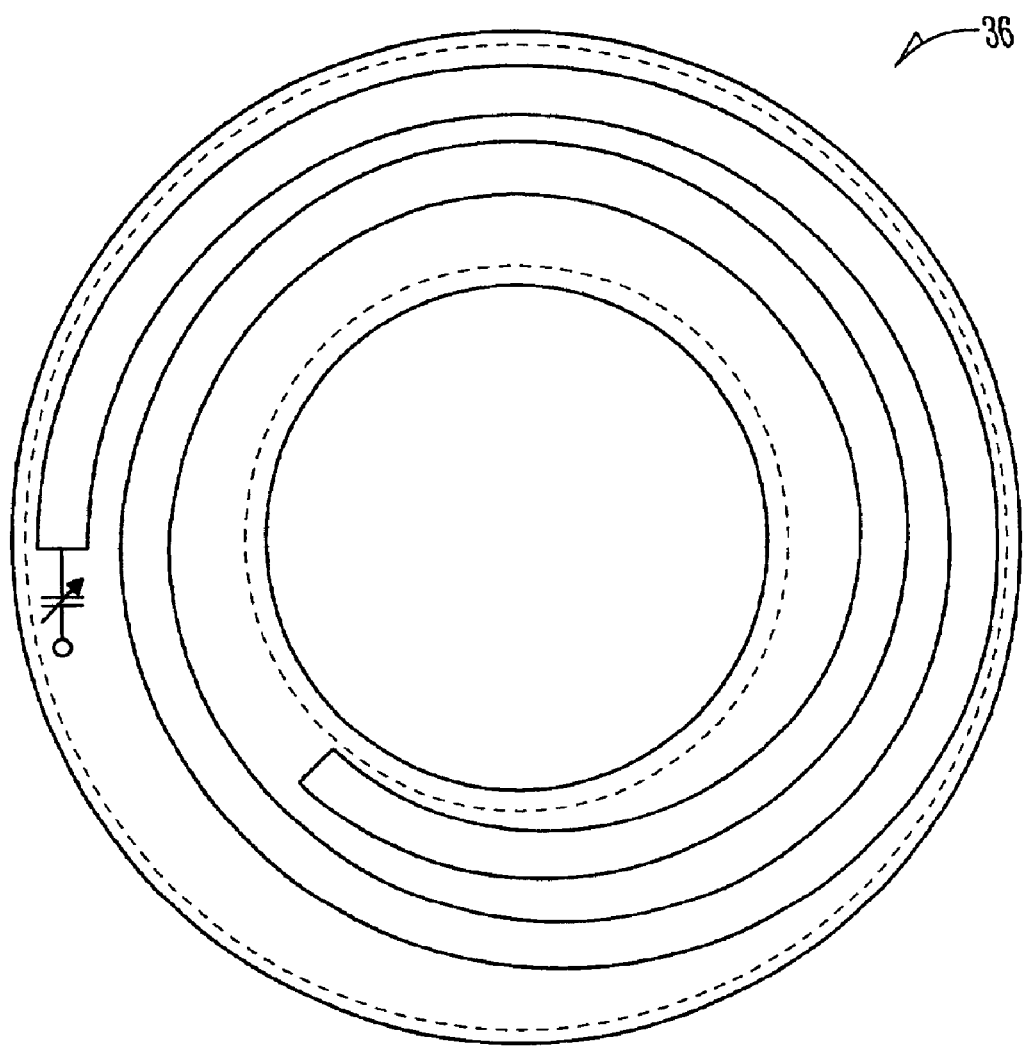

Further, the strip conductor or ground plane are, in one embodiment, formed in whole or in part from a non-conductive material such as copper or silver. As also illustrated, the strip conductor and ground plane, in this embodiment and others described below, is connected to a source of electrical excitation or RF detection circuitry, for example through a coax or other connector (not shown). According to still another example embodiment, because corners of the coil tend to radiate surface waves and thus have a potential to cause hot spots in images and degrade the Q value of coils, the corners may be chamfered to reduce the radiation loss and improve B1 distribution. According to another example embodiment 30 of the invention as illustrated in FIGS. 3A and 3B, a two turn coil is illustrated. As shown, a single ground plane 32 is shared by the strip conductors 34, wherein the ground planes are formed for example with a single sheet of foil so as to reduce radiation loss. FIGS. 3C and 3D illustrate additional embodiments 35 and 36 wherein embodiment 35 has one turn and embodiment 36 has two turns 102 to improve the homogeneity of the magnetic field characteristics.

In still other configurations, the coils may assume an "S" shape, as may be advantageously used for example in a volume coil design, or any other arbitrary shape. Further, as illustrated in FIGS. 2C and 3A, one or more elements 27 and 31, respectively, are connected to the transmission line so as to match the impedance of the line.

In another example embodiment as illustrated in FIGS. 4A and 4B, the MTL coil 42 is a half-volume coil having a plurality of microstrip transmission lines each having a ground plane 46 and strip conductor 48.

Figure 5A:
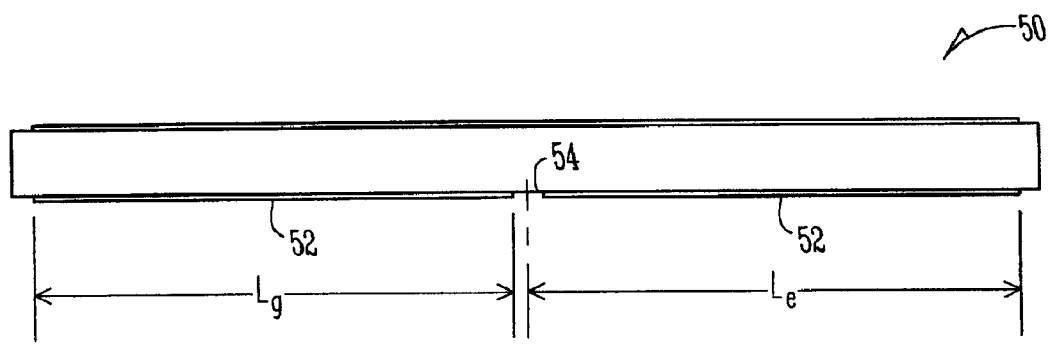
Figure 5B:
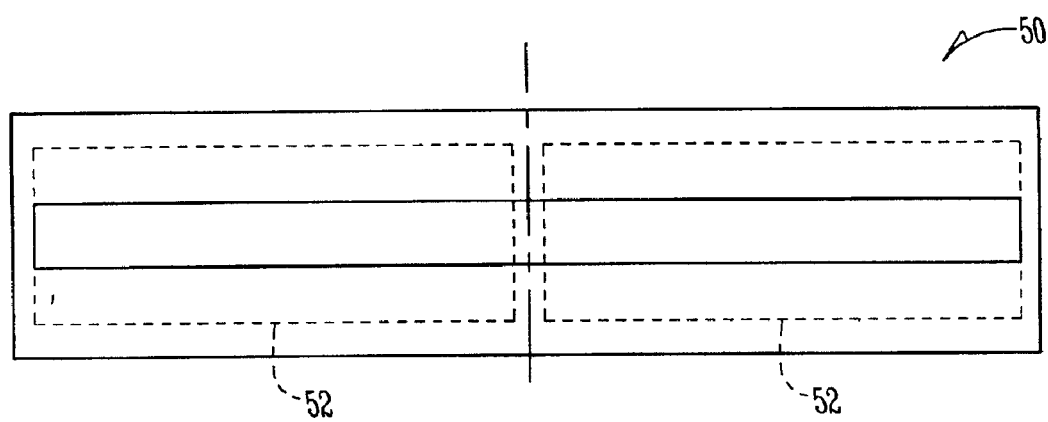
Figure 6:
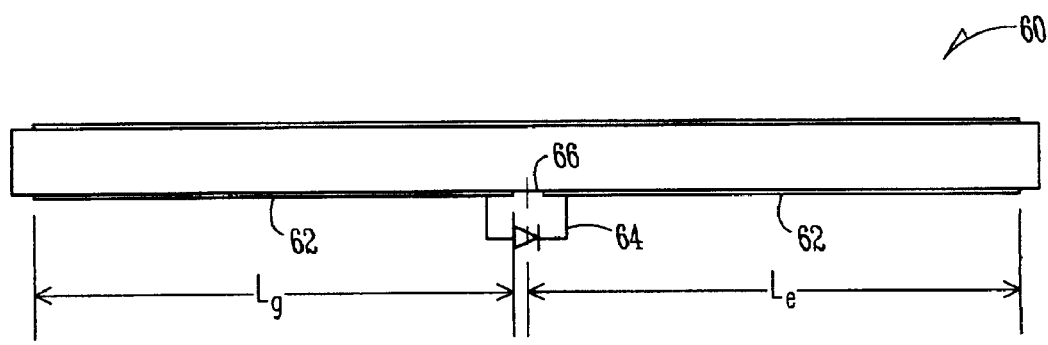

In still another example embodiment illustrated in FIGS. 5A and 5B, the MTL coil 50 includes a bisected ground plane 52. In this configuration, tuning of the resonance frequency is accomplished by adjusting displacement 54 of at least one of the ground planes. As illustrated in FIG. 6, in yet another embodiment 60, PIN diodes 64 are positioned in the gap 66 of the bisected ground planes 62, and used to detune the coil.

Figure 7A:
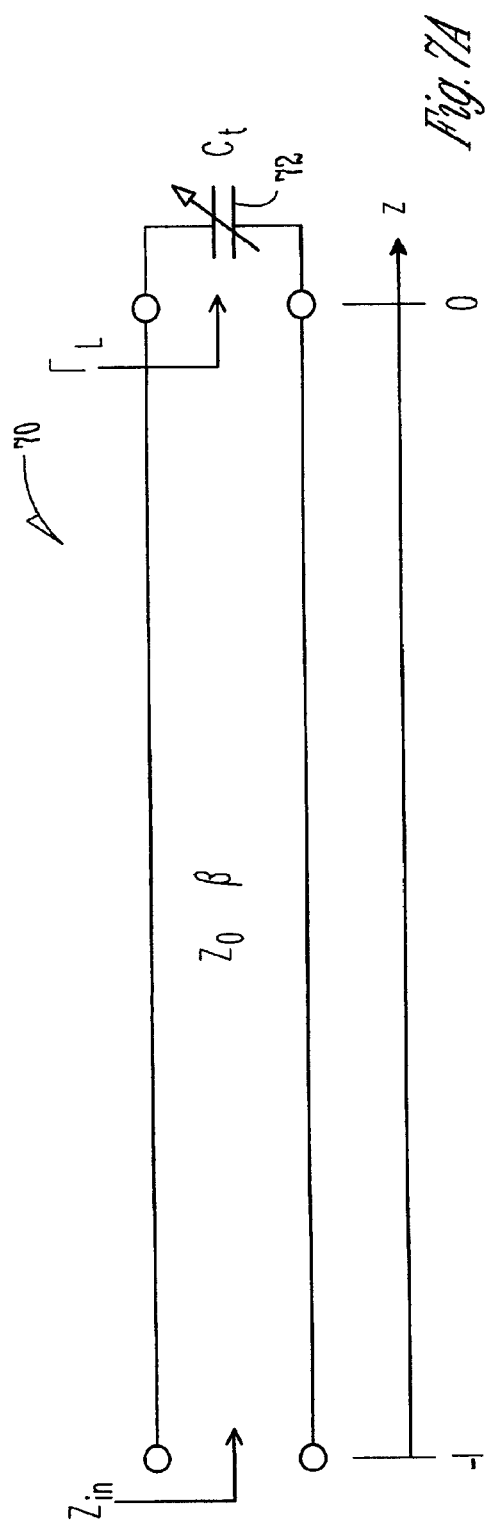
Figure 7B:
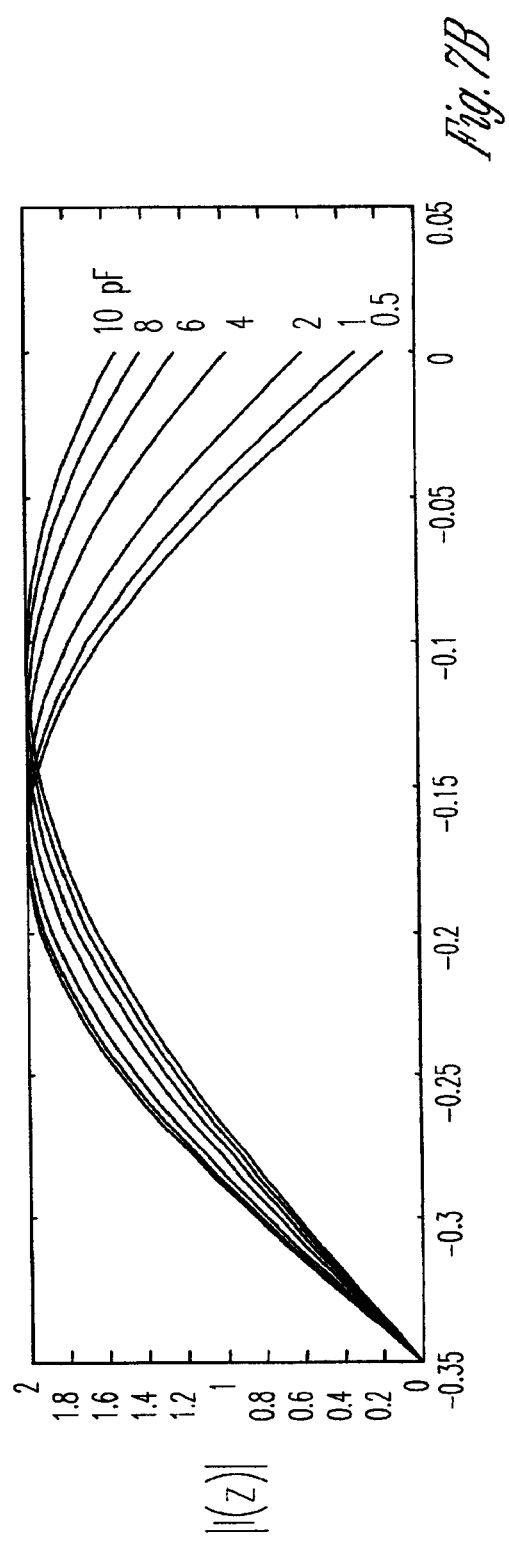
Figure 7C:
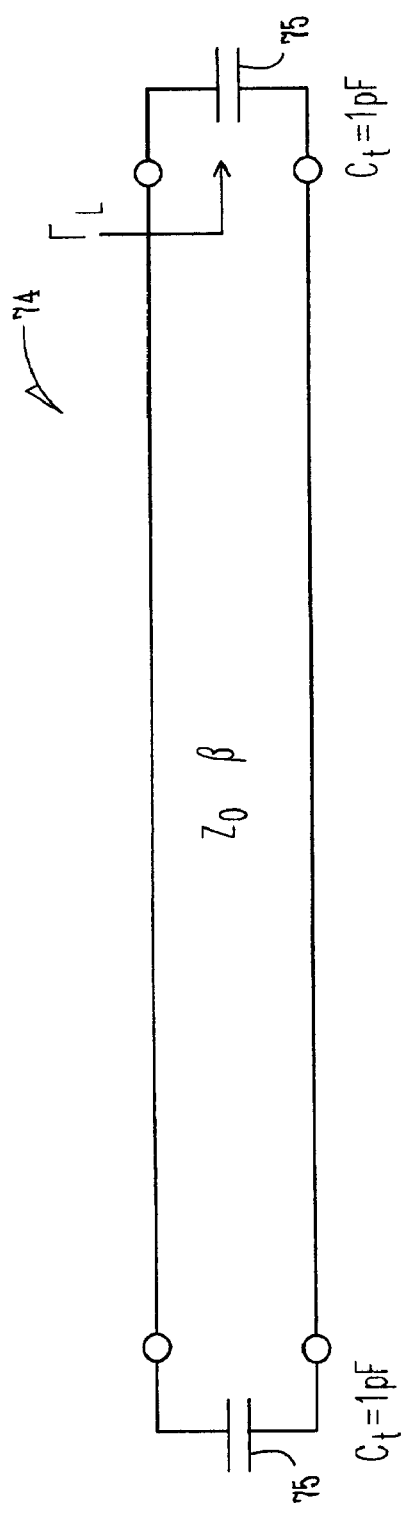
Figure 7D:
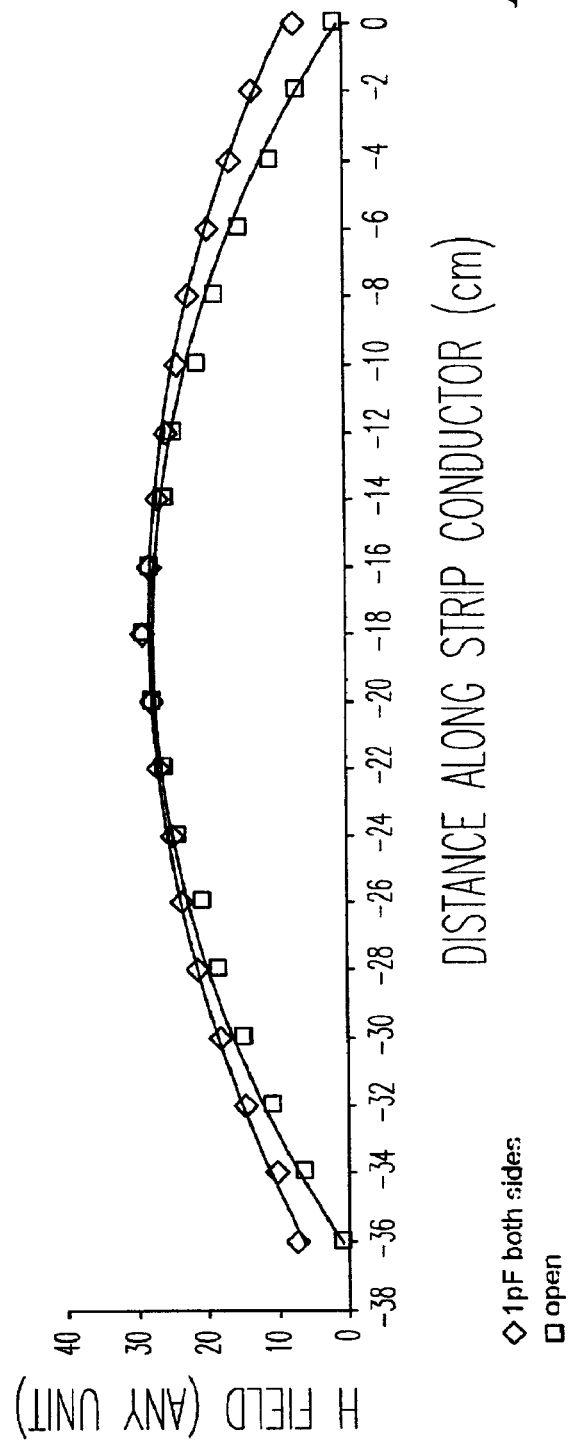

According to still other example embodiments of the apparatus of the invention illustrated in FIG. 7A, a MTL coil 70 is tuned by varying capacitive termination elements 72 on one end of the coil. FIG. 7B illustrates a hypothetical plot of magnetic field profile vs. capacitive termination value for a range of capacitances. As illustrated, increasing capacitive termination raises the magnetic field profile at the end of the coil at which the termination is applied. FIGS. 7C and 7D illustrate an example embodiment and field profile for tuning a MTL coil 74 by varying capacitive termination on each end 75 of the coil. Further, fine tuning can also be accomplished by slightly changing the length of the strip conductor.

Figure 8A:
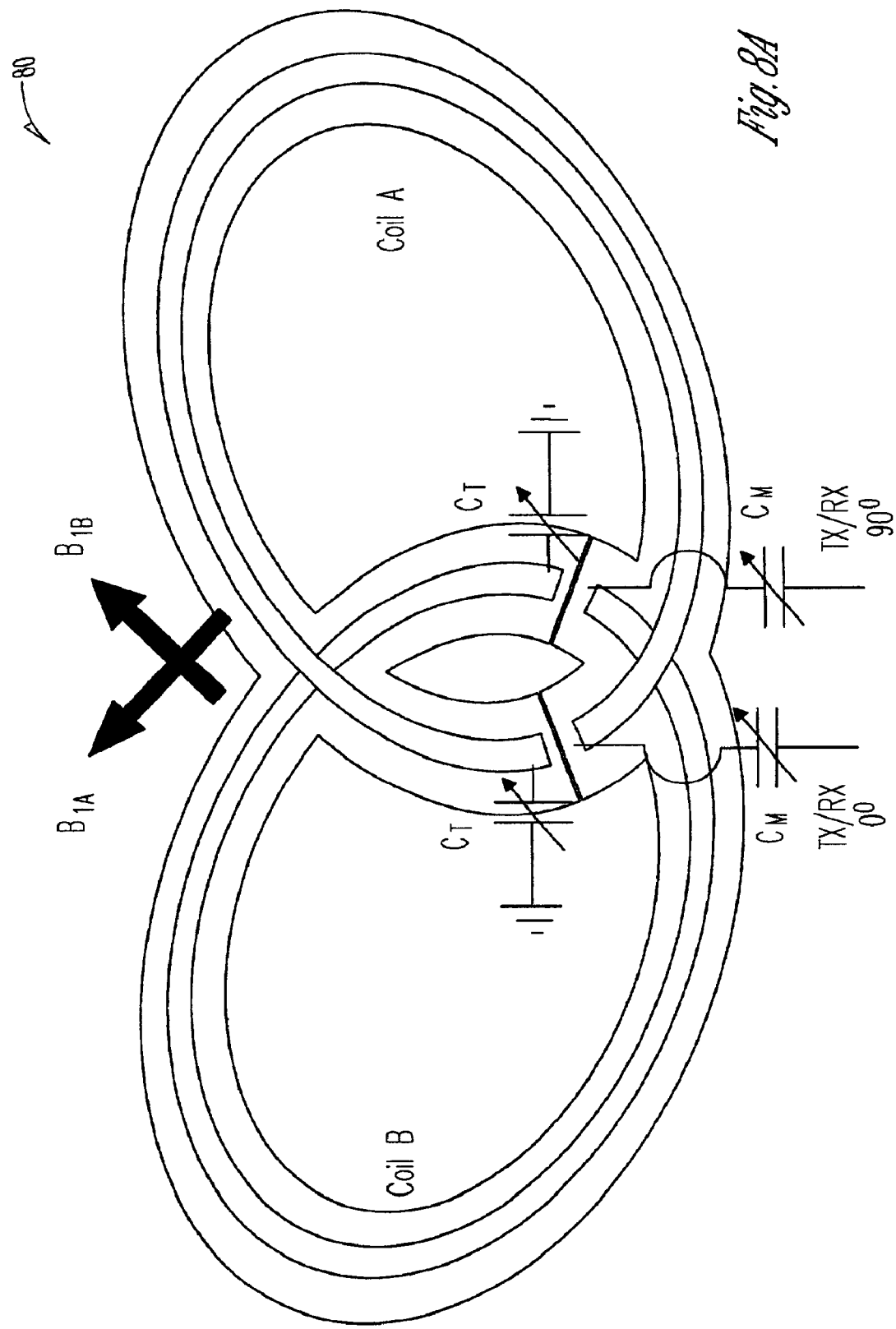
Figure 8B:
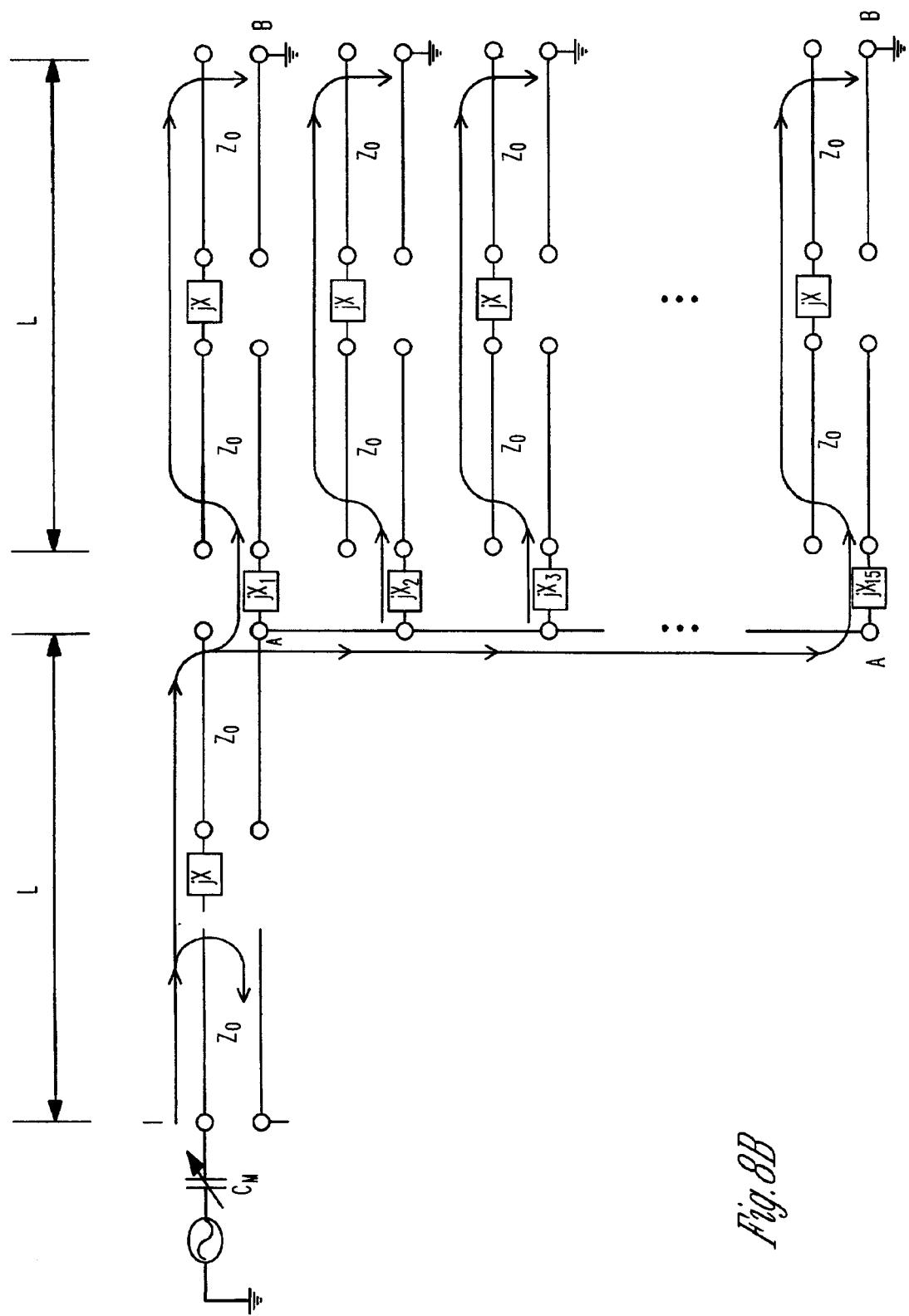

In yet still another embodiment illustrated in FIG. 8A, at least two of the MTL coils 80 are arranged to be operated in a quadrature mode. The equivalent electrical circuit for MTL coil 80 is illustrated in FIG. 8B. In this example schematic, Z0 is the characteristic impedance of each microstrip element. In the impendence jX, jX1, jX2, jX15, X, X1, X2, X15 are positive real numbers. For the mode 1, the current on each microstrip resonant element is modulated by a cosine function cos(npie/8) where n=0, 1, 2, ... , 15. L denotes the length of the volume coil 80.

Figure 9:
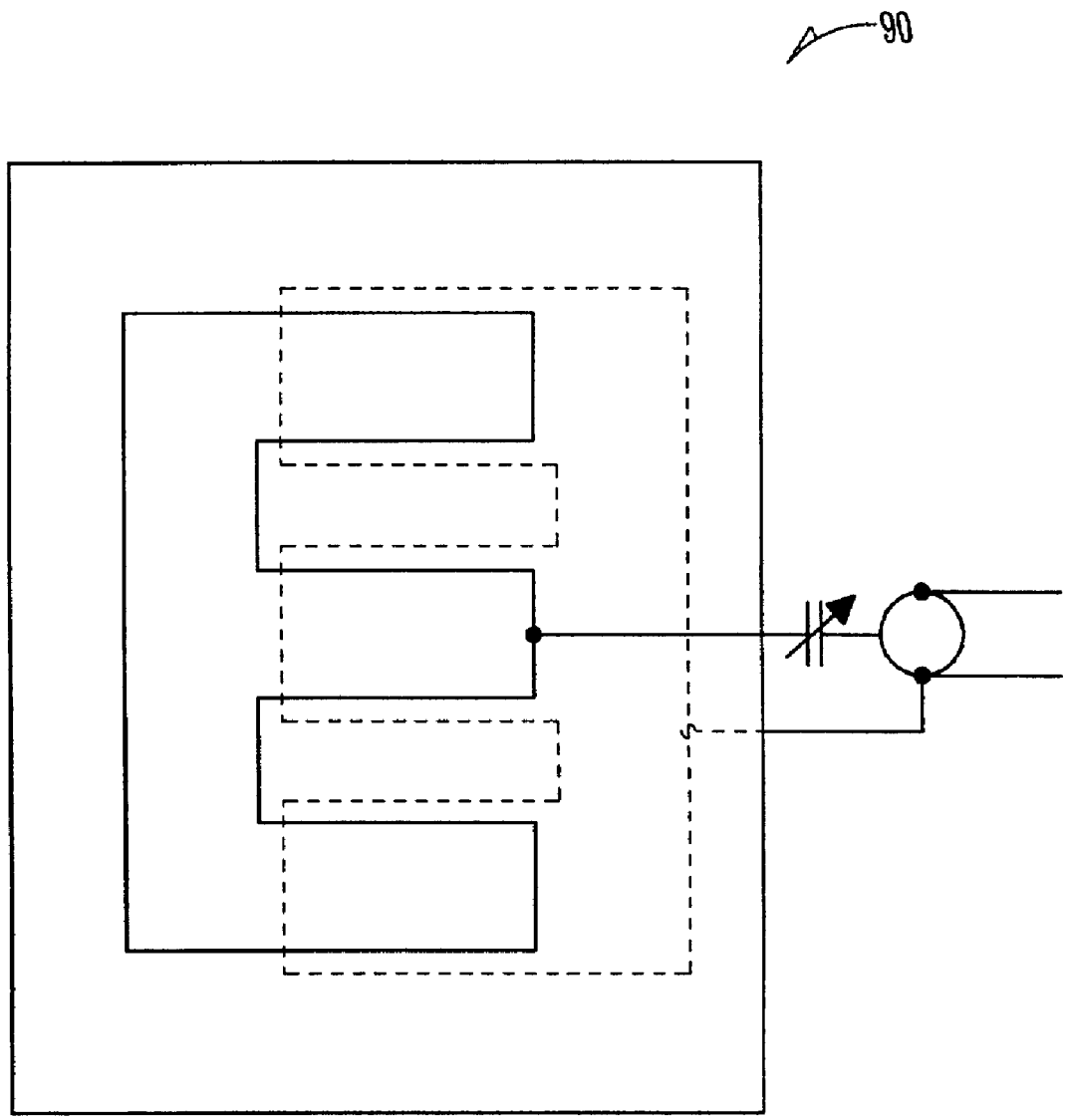
Figure 10A:
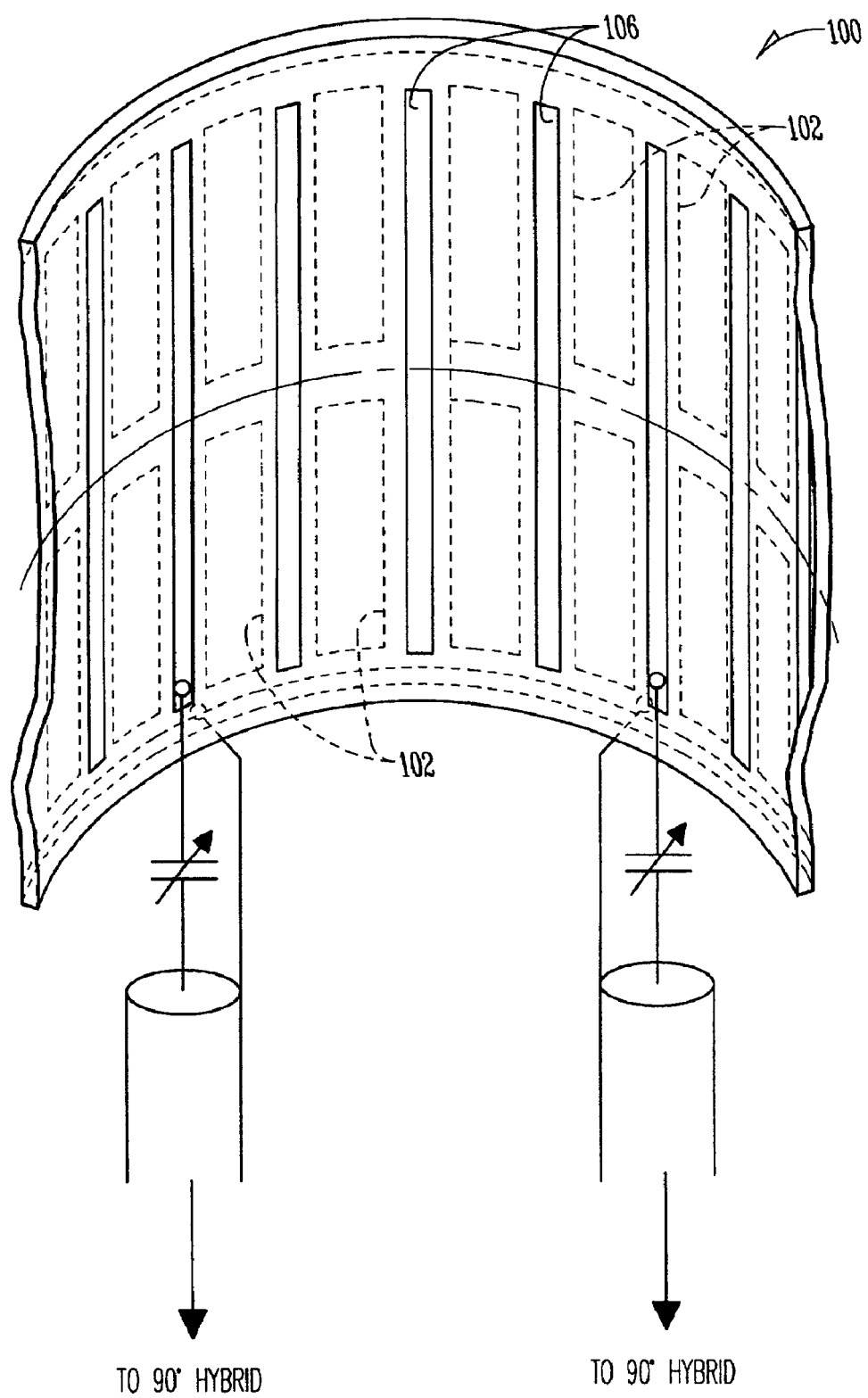
Figure 10B:
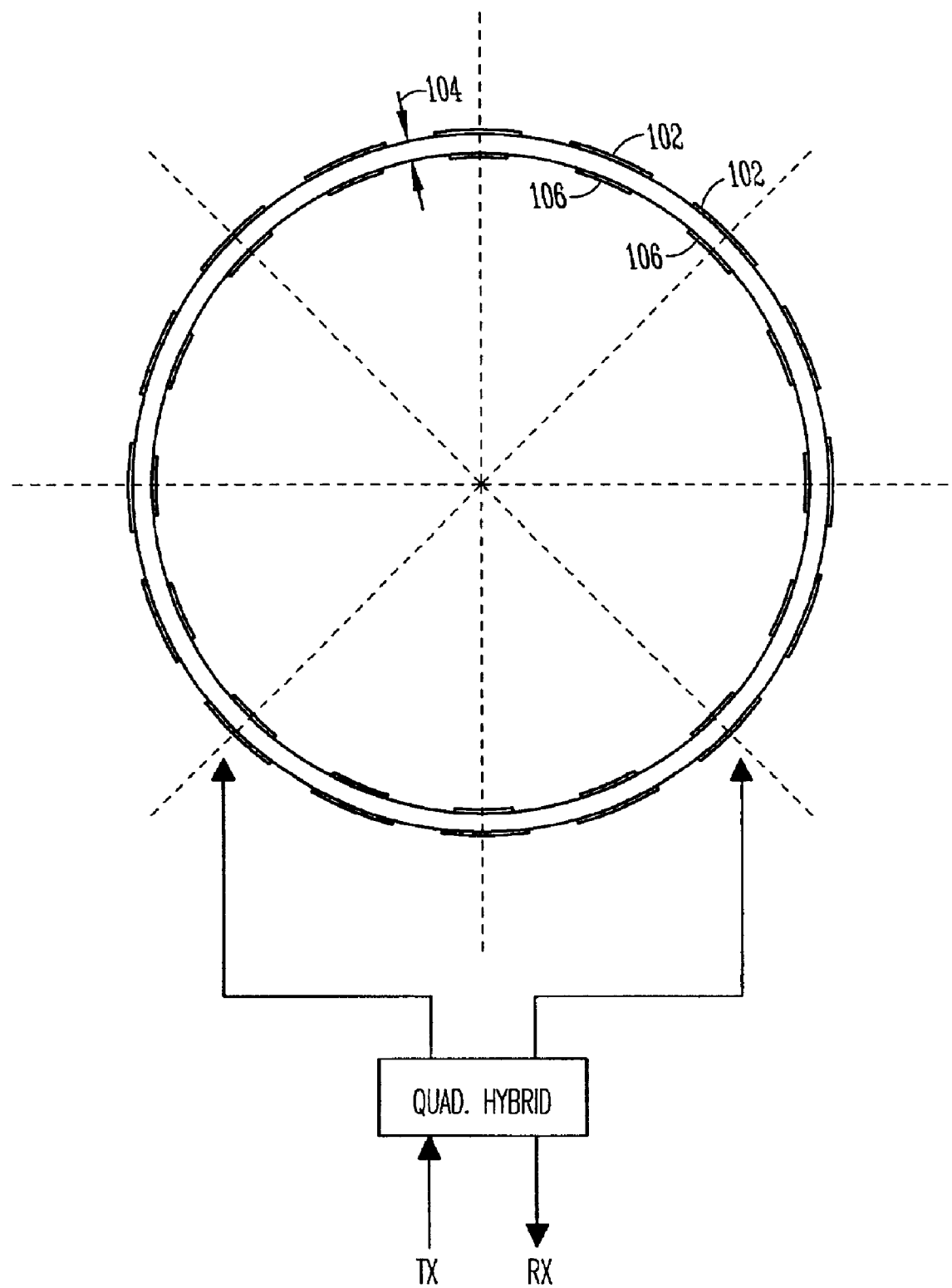

In another example embodiment shown in FIG. 9, an MTL coil 90 is fonned as arranged and operated as a ladder MTL coil. In yet another embodiment illustrated in schematic form in FIGS. 1 QA and LOB, a volume coil 100 is provided. Coil 100 includes ground planes 102 on the outside of a cylinder of dielectric material (for example Acrylic) having a diameter of 260 mm, a length of 210 mm, and a material thickness 104 of 6.35 mm. Strip conductors 106 are placed on the inside of the coil 100 running parallel to the axis. Coaxial connectors are provided to connect the ground planes and strip conductors to a source of electrical excitation or RF detectors, as is conventionally done in use of a MRI volume or surface coil. According to one example embodiment of the apparatus, the high permittivity of the human head, the dielectric resonance effect results in higher signal intensity in the central region of the image. This higher intensity can be taken into account in the design of a large volume coil at high fields. In one example embodiment, in order to achieve a relatively uniform MR image in the human head, an inhomogeneous B1 distribution in the transaxial plane in free space is intentionally designed to compensate for the dielectric resonance effect in the human head.

According to still another embodiment, for the individual microstrip resonant element, the resonant frequency can be modified by choosing appropriate dielectric substrate with different relative dielectric constant. Therefore, doubly tuned frequency operation can be easily achieved by making two different resonant frequencies for the microstrip elements in the volume coil, alternatively. Namely, one set of microstrip resonant elements with even numbers can be set to one resonance frequency while another set of microstrip resonant elements with odd numbers set to a different resonance frequency. Multiple tuned RF coils also can be designed using the same approach. Each resonance can be quadraturely driven with an appropriate quadrature hybrid.

Figure 11:
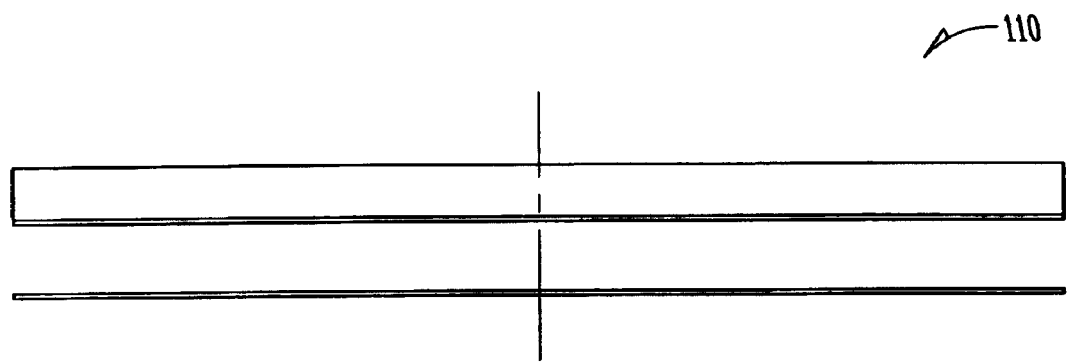

In still another example embodiment shown in FIG. 11, an inverted MTL coil 110 is illustrated, wherein is coupling is capacitive adjacent microstrip elements to provide lower resonant frequency operation.

Figure 12:
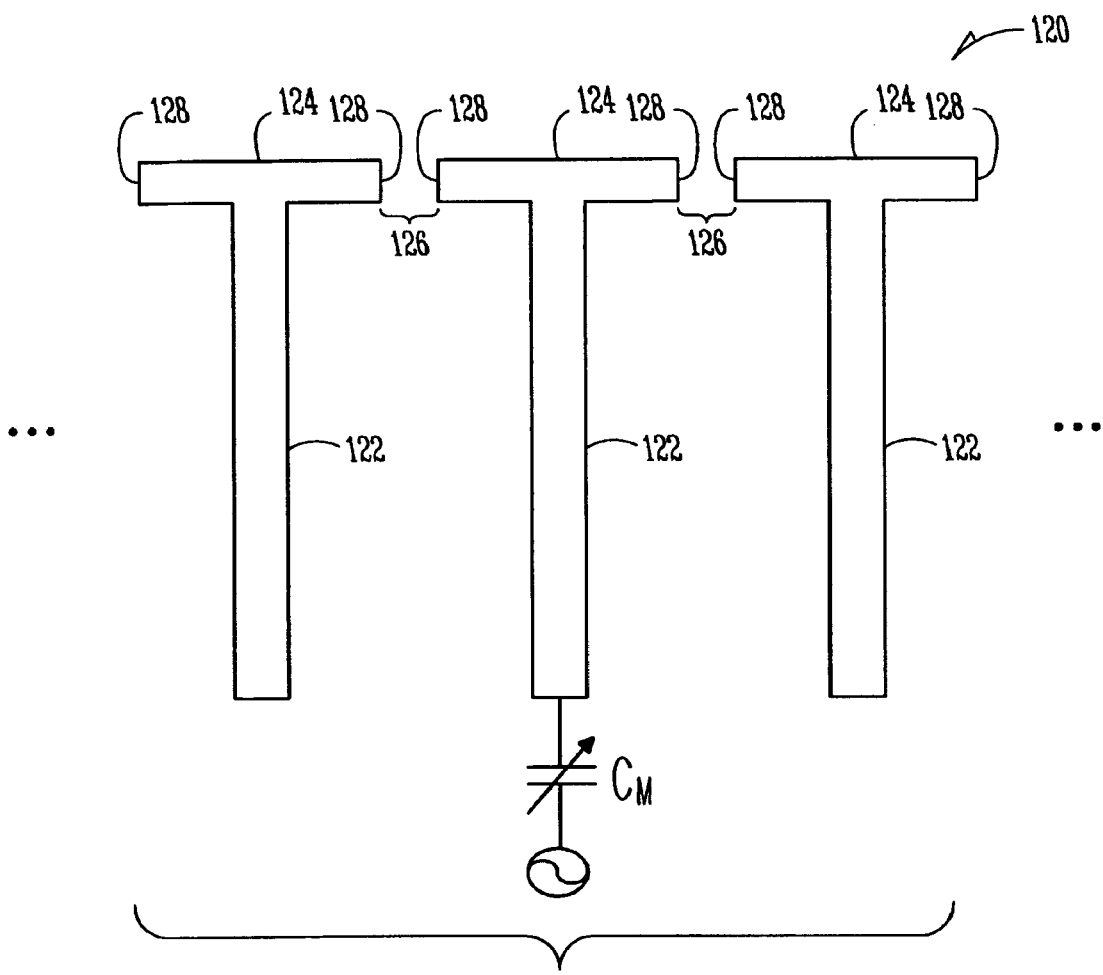

Still another example embodiment 120 of the invention is illustrated in FIG. 12, wherein the strip conductors 122 have 'T' shaped ends 124 and coupling gap 126 between tips 128 of the ends are adjusted to change the current and E field at the end of the coil, and thus allow the operating frequency to be raised.

Figure 13:
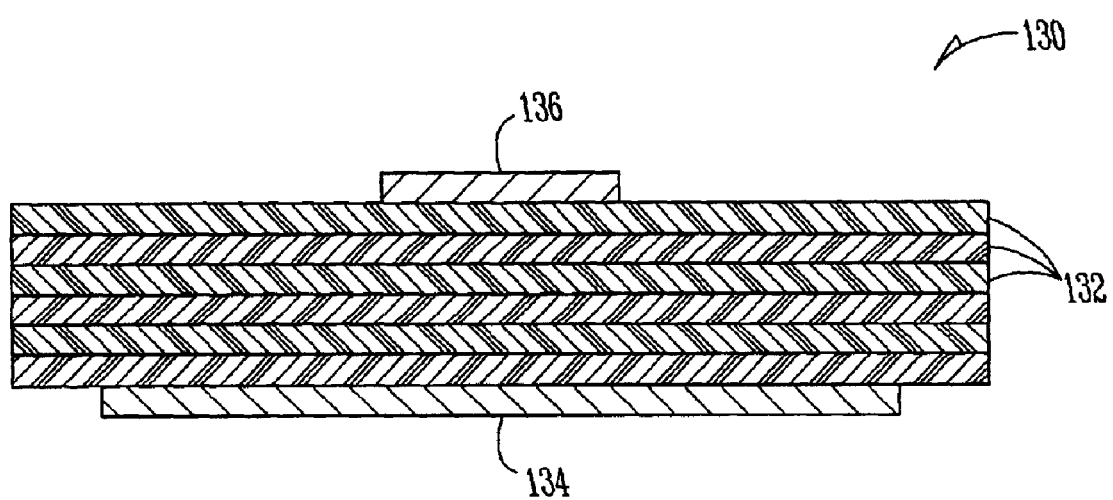

In yet still another example embodiment of the apparatus shown in FIG. 13, the MTL 130 substrate dielectric is formed of one or more relatively thin flexible layers 132 so that the coil may be bent or twisted or otherwise formed. Such layers may be formed of Teflon, for example. According to this embodiment, the coil 130 may be bent or formed into a first configuration, and thereafter formed into a second or third or more different configurations, wherein the coil may be used in more than one configuration and thus have a multipurpose nature. Metal conductors 134 and 136 are shown on opposite surfaces of the dielectric.

Figure 14:
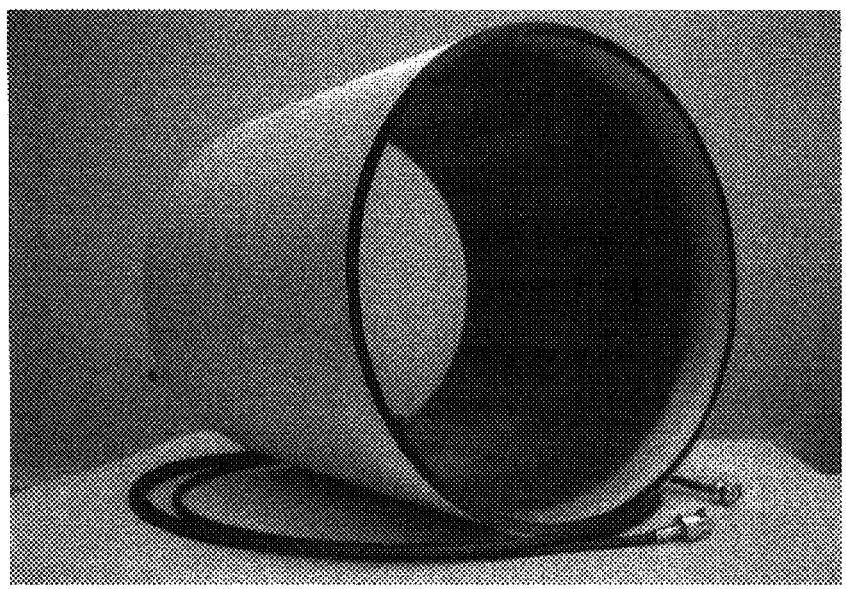

Referring now to FIG. 14, there is illustrated a photograph of yet one more example embodiment of a volume coil 140 according to the present invention.

According to still yet another example embodiment, the MTL coil is formed as a dome-shaped coil which offers an increased filling factor and a great sensitivity and homogeneity in the top area of the human head. By applying the microstrip resonator volume coil technique, the dome-shaped coil can be constructed for higher field applications.

According to still another embodiment of the invention, the unbalanced circuit of the microstrip coil provides that there is no need to use the balun circuit commonly used in surface coils and balanced volume coils to stabilize the coil's resonance and diminish the so-called 'cable resonance'.

Thus, there has been described above method and apparatus for forming MRI imaging and spectroscopy coils using microstrip transmission line. Due to its specific semi-open transmission line structure, substantial electromagnetic energy is stored in the dielectric material between the thin conductor and the ground plane, which results in a reduced radiation loss and a reduced perturbation of sample loading to the RF coil, compared to conventional surface coils. The MTL coils of the present invention are also characterized by a high Q factor, no RF shielding, small physical coil size, lower cost and easy fabrication. These MTL coils have the advantageous property of good performance while occupying a relatively small space, thus allowing MTL coils to be used inside restricted areas more easily than some other prior art coils. Further, the MTL coils of the present invention can be readily formed in a wide variety of coil configurations, and used in a wide variety of ways. Further, while the MTL coils of the present invention work well at high field strengths and frequencies, they also work at low frequencies and in low field strengths as well.

Further information concerning the design, operation and theory of MTL coils is found in Zhang, X. et al., "Microstrip RF Surface Coil Design for Extremely High-Field MRI and Spectroscopy", Magn. Reson. Med. 2001 September; 46(3):443–50 and Zhang X. et al., "A Novel RF Volume Coil Design Using Microstrip Resonator for NMR Imaging and Spectroscopy", submitted for publication. The entire contents of both of the aforementioned papers are incorporated herein by reference.

The invention claimed is:

1. A method of imaging a target comprising:
   positioning a target proximate a RF coil that includes a microstrip transmission line (MTL) wherein the microstrip transmission line includes a strip conductor, a ground plane and a dielectric material; and
   exciting the magnetizations of the target using the microstrip transmission line to generate magnetic resonance signals.

2. The method according to claim 1 further comprising receiving MR signals with the microstrip transmission line in the RF coil.

3. The method according to claim 1 wherein exciting the magnetizations of the target using the microstrip transmission line is performed at a magnetic field strength greater than 0.2 Tesla.

4. The method according to claim 1 further including receiving MR signals from the target using the microstrip transmission line.

5. The method according to claim 1 wherein exciting the magnetizations of the target using the microstrip transmission line is performed at a magnetic field strength greater than 0.2 Tesla and further including receiving MR signals from the target using the microstrip transmission line.

6. The method according to claim 1 wherein exciting the magnetizations of the target using the microstrip transmission line is performed at a magnetic field strength greater than 0.3 Tesla.

7. The method according to claim 1 wherein exciting the magnetizations of the target using the microstrip transmission line is performed at a magnetic field strength greater than 0.3 Tesla and further including receiving MR signals from the target using the microstrip transmission line.

8. The method according to claim 1 further including receiving MR signals from the target using the volume coil.

9. A method of imaging a target comprising: positioning a target proximate to a volume RF coil that includes a plurality of microstrip transmission lines and each microstrip transmission line including a strip conductor, a ground plane, and a dielectric medium; and imaging the target using the volume RF coil to generate magnetic resonance signals.

10. The method according to claim 9 wherein imaging the target using the volume RF coil includes exciting the magnetizations of the target using the volume RF coil.

11. The method according to claim 10 wherein imaging the target using the volume coil includes receiving MR signals using the volume RF coil.

12. The method according to claim 9 wherein the volume RF coil is a partly or fully semi-cylindrical or full-cylindrical volume RF coil.

13. The method according to claim 9 further comprising setting at least one microstrip transmission line at a first resonance frequency and setting at least one other microstrip transmission line at a second resonance frequency for double-tuned volume RF coils.

14. The method according to claim 9 further comprising connecting at least one microstrip transmission line to terminate with a capacitive termination element for frequency tuning and for reducing magnetic field variation.

15. A method of imaging comprising: positioning a target proximate to a RF coil with a microstrip transmission line that includes a substantially planar and non-linear shaped conductor, a ground plane and a dielectric material; and imaging the target using the RF coil to generate magnetic resonance signals.

16. The method according to claim 15 further comprising forming the microstrip transmission line with a substantially planar and non-linear shaped conductor, a ground plane and a dielectric material.

17. The method according to claim 16 further comprising controlling the dielectric constant by choosing a dielectric material of the microstrip transmission line to adjust the resonance frequency of the RF coil.

18. The method according to claim 16 wherein imaging the target using the RF coil includes exciting the microstrip transmission line with a capacitive impedance matching network.

19. The method according to claim 16 wherein forming the microstrip transmission line includes forming the substantially planar and non-linear shaped conductor in a shape selected from the group of an S-shape, a square, a triangle, or a circular shape.

20. The method according to claim 16 wherein forming the microstrip transmission line includes forming the substantially planar and non-linear shaped conductor with at least a fraction of one turn.

21. The method according to claim 16 wherein forming the microstrip transmission line includes forming the substantially planar and non-linear shaped conductor with at least one turn.

22. The method according to claim 21 wherein forming the substantially planar and non-linear shaped conductor with at least one turn includes chamfering corners on the conductor to reduce radiation loss.

23. The method according to claim 16 wherein forming the microstrip transmission line includes forming the substantially planar and non-linear shaped conductor with at least two turns to improve the RF magnetic field (B1) distribution generated by the MTL RF coil.

24. The method according to claim 15 further comprising forming a microstrip transmission line that includes a plurality of substantially planar and non-linear shaped conductors and a single ground plane that reduces radiation loss from each conductor.

25. The method according to claim 15 further comprising:
 forming a microstrip transmission line that includes a plurality of substantially planar and non-linear shaped conductors; and
 forming a plurality of ground planes such that each ground plane reduces radiation loss from a unique one of the conductors.

26. The method according to claim 15 further comprising forming a microstrip transmission line that includes a substantially planar and non-linear shaped conductor arranged in a form selected from the group of a fraction of turn, or an entire single-turn or multiple-turns loop of any arbitrary shape.

27. The method according to claim 15 further comprising connecting the substantially planar and non-linear shaped conductor to a RF power source.

28. The method according to claim 27 further comprising connecting the substantially planar and non-linear shaped conductor to RF detection circuitry.

29. A method according to claim 15 further wherein the substantially planar conductor is flat or curvilinear.

30. A method of imaging a target comprising: positioning a target proximate to an RF coil with a microstrip transmission line wherein the microstrip transmission line includes a strip conductor, a around plane and a dielectric material; connecting a first capacitive termination element to a first end of the microstrip transmission line to reduce variation in the B1 field produced by the coil; and imaging the target using the RF coil with improved B1 field to generate magnetic resonance signals.

31. The method according to claim 30 further comprising connecting a second capacitive termination element to a second end of the microstrip transmission line; and imaging the target using the RF coil with the improved B1 field.

32. The method according to claim 31 further comprising tuning the RF coil by varying the capacitance of the first and second capacitive termination elements.

33. The method according to claim 30 further comprising varying the capacitance of the first capacitive termination element.

34. The method according to claim 30 further comprising tuning the RF coil by varying a length of a conductor in the microstrip transmission line.

35. The method according to claim 30 further comprising forming the RF coil as a volume RF coil with a plurality of microstrip transmission lines, and wherein connecting a first capacitive termination element to a first end of the RF coil includes connecting the first capacitive termination element to one end of at least one microstrip transmission line.

36. The method according to claim 35 further comprising connecting a second capacitive termination, element to a second end of the microstrip transmission line; and imaging the target using the RF coil with the improved B1 field.

37. A method of imaging a target comprising: positioning a target proximate to a RF coil with a microstrip transmission line, the microstrip transmission line including a conductor, a dielectric and a ground plane that is segregated into at least two portions for achieving electric coupling among the microstrip transmission line elements and driving the RF coil; and imaging the target using the RF coil to generate magnetic resonance signals.

38. The method according to claim 37 further comprising connecting at least one capacitive termination element to an RF coil element.

39. The method according to claim 37 further comprising detuning the coil's resonance frequency by connecting at least one portion of the ground plane relative to the other portions of the ground plane.

40. The method according to claim 39 wherein connecting at least one portion of the ground plane relative to the other portions of the ground plane includes connecting a first portion of a bisected ground plane relative to a second portion of the bisected ground plane to detune the coil's resonance frequency.

41. The method according to claim 37 wherein imaging the target using the RF coil includes exciting the target using the microstrip transmission line, and further comprising detuning the RF coil using at least one pin diode applied to at least one portion of the ground plane.

42. The method according to claim 37 wherein imaging the target using the RF coil includes exciting the target using the microstrip transmission line, and further comprising positioning a pin diode in a gap between at least two portions of the ground plane such that the pin diode is applied to the at least two portions of the ground plane.

43. A method of imaging a target comprising: positioning a target proximate to a RF coil with at least one microstrip transmission line to generate magnetic resonance signals, the microstrip transmission line including a conductor, a dielectric and a ground plane that is terminated by at least one pin diode at the end of the microstrip transmission line to detuning the coil's resonance frequency.

44. The method according to claim 43 further comprising multiple RF coils with at least two microstrip transmission lines with the terminated pin diodes to constitute a multiple-RF coil system for serving phased-array RF coils for general MRI applications and parallel receiver coils for the parallel MRI applications.

45. An apparatus for imaging a target to generate magnetic resonance signals comprising a volume RF coil with a plurality of microstrip transmission lines wherein each microstrip transmission line includes a strip conductor, a ground plane and a dielectric material.

46. The apparatus according to claim 45 wherein each of the plurality of microstrip transmission lines includes a strip conductor, a ground plane and a dielectric material.

47. The apparatus according to claim 45 wherein the volume RF coil is a cylindrical volume coil.

48. The apparatus according to claim 45 wherein the volume RF coil is a semi-cylindrical volume coil.

49. The apparatus according to claim 45 wherein the volume RF coil is a ladder coil.

50. The apparatus according to claim 45 wherein at least one microstrip transmission line is adapted to operate at a first resonance frequency and at least one other microstrip transmission line is adapted to operate at a second resonance frequency.

51. The apparatus according to claim 45 further comprising a capacitive termination element connected to at least one end of at least one microstrip transmission line.

52. An apparatus for imaging a target to generate magnetic resonance signals comprising a RF coil with a microstrip transmission line that includes a substantially planar and non-linear shaped conductor a ground plane and a dielectric material.

53. The apparatus according to claim 52 wherein the microstrip transmission line further includes a ground plane and a dielectric material.

54. The apparatus according to claim 53 wherein a dielectric constant of the dielectric material is adjustable by changing the dielectric material to change a resonance frequency of the RF coil.

55. The apparatus according to claim 53 wherein the dielectric material includes a low-loss dielectric material.

56. The apparatus according to claim 53 wherein the substantially planar and non-linear shaped conductor is selected from the group of silver, or copper or other low-loss and/or non-magnetic metals.

57. The apparatus according to claim 53 wherein the dielectric material is formed from a plurality of layers.

58. The apparatus according to claim 57 wherein at least one of the plurality of layers of dielectric material includes a low-loss material.

59. The apparatus according to claim 52 further comprising a capacitive impedance matching network connected to the at least one of the microstrip transmission lines.

60. The apparatus according to claim 52 wherein the substantially planar and non-linear shaped conductor is S-shaped.

61. The apparatus according to claim 52 wherein the substantially planar and non-linear shaped conductor includes at least a fraction of one turn.

62. The apparatus according to claim 52 wherein the substantially planar and non-linear shaped conductor includes at least one turn.

63. The apparatus according to claim 62 wherein the substantially planar and non-linear shaped conductor with at least one turn includes chamfered corners to reduce radiation loss.

64. The apparatus according to claim 52 wherein the substantially planar and non-linear shaped conductor includes at least two turns to improve the B1 pattern of the RF coil.

65. The apparatus according to claim 52 further comprising at least one additional conductor, and a single piece ground plane that reduces radiation loss from each conductor.

66. The apparatus according to claim 52 further comprising at least one additional conductor and a plurality of ground planes such that each ground plane reduces radiation loss from at least one of the conductors.

67. The apparatus according to claim 52 wherein the substantially planar and non-linear shaped conductor is arranged in a loop of any arbitrary shape.

68. The apparatus according to claim 52 further comprising a source of RF power connected to the substantially planar and non-linear shaped conductor.

69. The apparatus according to claim 52 further wherein the coil is a volume coil.

70. The apparatus according to claim 52 further comprising RF detection circuitry connected to the substantially planar and non-linear shaped conductor.

71. The apparatus according to claim 52 wherein the substantially planar and non-linear shaped conductor is circular.

72. The apparatus according to claim 52 wherein the substantially planar and non-linear shaped conductor has a shape selected from the group of a square-shaped or a circular shape.

73. The apparatus according to claim 52 further comprising lumped elements connected to the microstrip transmission line to provide impedance matching.

74. The apparatus according to claim 52 further comprising a second coil with a microstrip transmission line that includes a substantially planar and non-linear shaped conductor, the microstrip transmission lines of both coils being arranged to provide quadrature operation.

75. The apparatus according to claim 52 further comprising at least two coils with a microstrip transmission line that includes a substantially planar and non-linear shaped conductor, the microstrip transmission lines of these coils being arranged to provide a multiple receiver coil system for the phased array and parallel MRI applications.

76. The apparatus according to claim 52 further including a first capacitive termination element connected to a first end of the microstrip transmission line to reduce variation in the B1 field produced by the coil.

77. An apparatus for imaging a target comprising:
an RF coil with a microstrip transmission line wherein the microstrip transmission line includes a strip conductor, a ground plane and a dielectric material; and
a first capacitive termination element connected to a first end of the RF coil and configured to generate magnetic resonance signals.

78. The apparatus according to claim 77 further comprising a second capacitive termination element connected to a second end of the RF coil.

79. The apparatus according to claim 77 wherein the capacitance of the first capacitive termination element is variable to adjust the magnetic field at the first end of the RF coil.

80. The apparatus according to claim 77 wherein a length of a conductor in the microstrip transmission line is variable to adjust the resonant frequency of the RF coil.

81. The apparatus according to claim 77 wherein the RF coil is a volume RF coil with a plurality of microstrip transmission lines such that the first capacitive termination element is connected to one end of at least one microstrip transmission line.

82. The apparatus according to claim 81 wherein the first capacitive termination element is connected to an opposing end of the at least one microstrip transmission line.

83. The apparatus according to claim 82 further comprising additional capacitive termination elements such that each microstrip transmission line is connected to a unique capacitive termination element.

84. A RF coil with a microstrip transmission line for imaging a target comprising:
a conductor,
a ground plane that is segregated into at least two portions; and
a dielectric between the conductor and the ground plane and configured to generate magnetic resonance signals.

85. The RF coil according to claim 84 further comprising a capacitive termination element connected to the conductor.

86. The RF coil according to claim 84 wherein at least one portion of the ground plane is movable relative to the other portions of the ground plane to detune the RF coil's resonance frequency.

87. The RF coil according to claim 84 wherein the ground plane is bisected into a first portion and a second portion.

88. The RF coil according to claim 87 wherein the first and second portions of the bisected ground plane are movable relative to one another to detune the RF coil's resonance frequency.

89. The RF coil according to claim 84 further comprising a pin diode applied to at least one portion of the ground plane to detune the RF coil when the RF coil is not used to excite a target or receive the MR signals from the target.

90. The RF coil according to claim 89 wherein the pin diode is applied to at least two portions of the ground plane and is positioned in a gap between the at least two portions of the ground plane to detune the RF coil when the RF coil is not used to excite a target or receive the MR signals from the target.

91. An apparatus for imaging a target comprising: positioning a target proximate to a RF coil with at least one microstrip transmission line, the microstrip transmission line including a conductor, a dielectric and a ground plane that is terminated by at least one pin diode at the end of the microstrip transmission line to detune the coil's resonance frequency when the RF coil is not used to receive magnetic resonance (MR) signals from the target.

92. The apparatus according to claim 91 further comprising multiple RF coils with at least two microstrip transmission lines with the terminated pin diodes to constitute a multiple-RF receiver coil system with the detuning capability when the RF coils are not used to receive the MR signals from the target.

93. A method of imaging comprising:
forming a microstrip transmission line with a substantially planar and non-linear shaped conductor, a ground plane and a dielectric material, wherein forming the microstrip transmission line includes forming the substantially planar and non-linear shaped conductor with at least a fraction of one turn;
positioning a target proximate to a RF coil with the microstrip transmission line; and
imaging the target using the RF coil.

94. The method according to claim 93 wherein forming the microstrip transmission line includes forming the substantially planar and non-linear shaped conductor with at least one turn.

95. The method according to claim 94 wherein forming the substantially planar and non-linear shaped conductor with at least one turn includes chamfering corners on the conductor to reduce radiation loss.

96. The method according to claim 93 wherein forming the microstrip transmission line includes forming the substantially planar and non-linear shaped conductor with at least two turns to improve the RF magnetic field (B1) distribution generated by the MTL RF coil.

97. The method according to claim 93 further comprising forming a microstrip transmission line that includes a substantially planar and non-linear shaped conductor arranged in a form selected from the group of a fraction of turn, an entire single-turn or multiple-turns loop of any arbitrary shape.

98. A method of imaging a target comprising:
positioning a target proximate to a RF coil with a microstrip transmission line, the microstrip transmission line including a conductor, a dielectric and a ground plane that is segregated into at least two portions for achieving electric coupling among the microstrip transmission line elements and driving the RF coil;
positioning a pin diode in a gap between at least two portions of the ground plane such that the pin diode is applied to the at least two portions of the ground plane; and
imaging the target using the RF coil, wherein imaging the target using the RF coil includes exciting the target using the microstrip transmission line.

99. An apparatus for imaging a target comprising a RF coil with a microstrip transmission line that includes a substantially planar and non-linear shaped conductor wherein the substantially planar and non-linear shaped conductor is S-shaped.

100. An apparatus for imaging a target comprising a RF coil with a microstrip transmission line that includes a substantially planar and non-linear shaped conductor wherein the substantially planar and non-linear shaped conductor includes at least a fraction of one turn.

101. An apparatus for imaging a target comprising a RF coil with a microstrip transmission line that includes a substantially planar and non-linear shaped conductor wherein the substantially planar and non-linear shaped conductor includes at least one turn.

102. The apparatus according to claim 101 wherein the substantially planar and non-linear shaped conductor with at least one turn includes chamfered corners to reduce radiation loss.

103. An apparatus for imaging a target comprising a RF coil with a microstrip transmission line that includes a substantially planar and non-linear shaped conductor wherein the substantially planar and non-linear shaped conductor includes at least two turns to improve the B1 pattern of the RF coil.

104. An apparatus for imaging a target comprising a RF coil with a microstrip transmission line that includes a substantially planar and non-linear shaped conductor wherein the substantially planar and non-linear shaped conductor is arranged in a loop of any arbitrary shape.

105. A RF coil with a microstrip transmission line for imaging a target comprising:

a conductor, a ground plane that is segregated into at least two portions; and a dielectric between the conductor and the ground plane; and wherein at least one portion of the ground plane is movable relative to the other portions of the ground plane to detune the RF coil's resonance frequency.

106. The RF coil according to claim 105 wherein the ground plane is bisected into a first portion and a second portion and the first and second portions of the bisected ground plane are movable relative to one another to detune the RF coil's resonance frequency.

107. A RF coil with a microstrip transmission line for imaging a target comprising:

a conductor, a ground plane that is segregated into at least two portions; and a dielectric between the conductor and the ground plane; and further comprising a pin diode applied to at least one portion of the ground plane to detune the RF coil when the RF coil is not used to excite a target or receive the MR signals from the target and wherein the pin diode is applied to at least two portions of the ground plane and is positioned in a gap between the at least two portions of the ground plane to detune the RF coil when the RF coil is not used to excite a target or receive the MR signals from the target.

* * * * *

UNITED STATES PATENT AND TRADEMARK OFFICE
CERTIFICATE OF CORRECTION

PATENT NO. : 7,023,209 B2
APPLICATION NO. : 09/974184
DATED : April 4, 2006
INVENTOR(S) : Zhang et al.

It is certified that error appears in the above-identified patent and that said Letters Patent is hereby corrected as shown below:

On the Title page, item (56), under "Foreign Patent Documents", in column 2, line 1, after "9/1992" insert -- A61B/5/055 --.

On the Title page, item (56), under "Foreign Patent Documents", in column 2, line 5, after "10/1999" insert -- G01V/3/32 --.

On page 2, item (56), under "U.S. Patent Documents", in column 1, line 6, delete "Mamets et al." and insert -- Mametsa et al. --, therefor.

On page 2, item (56), under "Other Publications", in column 1, line 2, delete "IEE" and insert -- IEEE --, therefor.

On page 2, item (56), under "Other Publications", in column 1, line 8, delete "Pag" and insert -- Page --, therefor.

On page 2, item (56), under "Other Publications", in column 1, line 13, delete "Medicne" and insert -- Medicine --, therefor.

On page 2, item (56), under "Other Publications", in column 1, line 17, delete "Pyhsical " and insert -- Physical --, therefor.

On page 2, item (56), under "Other Publications", in column 2, lines 11-12, delete "Enciclopedia of Ellectronics" and insert -- Encyclopaedia of Electronics --, therefor.

On page 2, item (56), under "Other Publications", in column 2, lines 13-14, delete "Enciclopedia of Ellectronics" and insert -- Encyclopaedia of Electronics --, therefor.

On page 2, item (56), under "Other Publications", in column 2, lines 15-16, delete "Enciclopedia of Ellectronics" and insert -- Encyclopaedia of Electronics --, therefor.

On page 2, item (56), under "Other Publications", in column 2, lines 17-18, delete "Enciclopedia of Ellectronics" and insert -- Encyclopaedia of Electronics --, therefor.

On page 2, item (56), under "Other Publications", in column 2, lines 19-20, delete "Enciclopedia of Ellectronics" and insert -- Encyclopaedia of Electronics --, therefor.

On page 2, item (56), under "Other Publications", in column 2, line 26, after "Mechanisms" insert -- of --.

UNITED STATES PATENT AND TRADEMARK OFFICE
CERTIFICATE OF CORRECTION

PATENT NO. : 7,023,209 B2
APPLICATION NO. : 09/974184
DATED : April 4, 2006
INVENTOR(S) : Zhang et al.

It is certified that error appears in the above-identified patent and that said Letters Patent is hereby corrected as shown below:

On page 2, item (56), under "Other Publications", in column 2, line 27, delete "sueprconductors" and insert -- superconductors --, therefor.

In column 2, line 5, delete "DRAWING" and insert -- DRAWINGS --, therefor.

In column 5, line 12, delete "fonned" and insert -- formed --, therefor.

In column 5, line 14, delete " 1 QA and LOB" and insert -- 10A and 10B --, therefor.

In column 5, line 58, after "MTL" insert -- coil --.

In column 6, line 51, in Claim 1, after "material" delete ";" and insert -- between the conductor and the ground plane; --, therefor.

In column 7, line 17, in Claim 9, after "medium" delete ";" and insert -- between the conductor and the ground plane; --, therefor.

In column 7, line 40, in Claim 15, after "material" delete ";" and insert -- between the conductor and the ground plane; --, therefor.

In column 8, line 39, in Claim 30, delete "around" and insert -- ground --, therefor.

In column 8, line 39, in Claim 30, after "material" delete ";" and insert -- between the conductor and the ground plane; --, therefor.

In column 8, line 65, in Claim 36, after "termination" delete ",".

In column 9, line 4, in Claim 37, delete "that" and insert -- wherein the dielectric is between the conductor and the ground plane and wherein the microstrip transmission line --, therefor.

In column 9, line 39, in Claim 43, after "frequency" delete "." and insert -- and wherein the dielectric is between the conductor and the ground plane. --, therefor.

In column 9, line 50, in Claim 45, after "material" delete "." and insert -- between the conductor and the ground plane. --, therefor.

In column 10, line 5, in Claim 52, after "material" delete "." and insert -- between the conductor and the ground plane. --, therefor.

UNITED STATES PATENT AND TRADEMARK OFFICE
CERTIFICATE OF CORRECTION

PATENT NO. : 7,023,209 B2
APPLICATION NO. : 09/974184
DATED : April 4, 2006
INVENTOR(S) : Zhang et al.

It is certified that error appears in the above-identified patent and that said Letters Patent is hereby corrected as shown below:

In column 11, line 22, in Claim 77, after "material" delete ";" and insert -- between the conductor and the ground plane; --, therefor.

In column 12, line 13, in Claim 91, delete "that" and insert -- wherein the dielectric is between the conductor and the ground plane and wherein the microstrip transmission line --, therefor.

In column 12, line 16, in Claim 91, after "receive" insert -- the --.

In column 12, line 28, in Claim 93, after "material" delete "," and insert -- between the conductor and the ground plane --, therefor.

In column 12, line 58, in Claim 98, delete "that" and insert -- wherein the dielectric is between the conductor and the ground plane and wherein the microstrip transmission line --, therefor.

In column 13, line 3, in Claim 99, delete "conductor" and insert -- conductor, a ground plane and a dielectric between the conductor and the ground plane, --, therefor.

In column 13, line 8, in Claim 100, delete "conductor" and insert -- conductor, a ground plane and a dielectric between the conductor and the ground plane, --, therefor.

In column 13, line 13, in Claim 101, delete "conductor" and insert -- conductor, a ground plane and a dielectric between the conductor and the ground plane, --, therefor.

UNITED STATES PATENT AND TRADEMARK OFFICE
CERTIFICATE OF CORRECTION

PATENT NO. : 7,023,209 B2
APPLICATION NO. : 09/974184
DATED : April 4, 2006
INVENTOR(S) : Zhang et al.

It is certified that error appears in the above-identified patent and that said Letters Patent is hereby corrected as shown below:

In column 13, line 22, in Claim 103, delete "conductor" and insert -- conductor, a ground plane and a dielectric between the conductor and the ground plane, --, therefor.

In column 13, line 28, in Claim 104, delete "conductor" and insert -- conductor, a ground plane and a dielectric between the conductor and the ground plane, --, therefor.

Signed and Sealed this

Fifteenth Day of August, 2006

JON W. DUDAS
*Director of the United States Patent and Trademark Office*

UNITED STATES PATENT AND TRADEMARK OFFICE
CERTIFICATE OF CORRECTION

PATENT NO.        : 7,023,209 B2
APPLICATION NO.   : 09/974184
DATED             : April 4, 2006
INVENTOR(S)       : Xiaoliang Zhang, Kamil Ugurbil and Wei Chen It is certified that error appears in the above-identified patent and that said Letters Patent is hereby corrected as shown below:

In the Specifications

In Column 1, Lines 15 to 22 delete the following:

"GOVERNMENT RIGHTS

This invention was partially supported by NIH grants NS38070 (W.C.), NS39043 (W.C.), P41 RR08079 (a National Research Resource grant from NIH), Keck Foundation, National Foundation for Functional Brain Imaging and the US Department of Energy. The Government may have certain rights in the invention."

and add the following:

--GOVERNMENT INTEREST

This invention was made with government support under NS038070, NS039043, P41-RR008079 awarded by the National Institutes of Health. The government has certain rights in the invention.--

Signed and Sealed this
Twenty-third Day of April, 2013

Teresa Stanek Rea
*Acting Director of the United States Patent and Trademark Office*